(12) United States Patent
Robustelli et al.

(10) Patent No.: US 12,295,147 B2
(45) Date of Patent: May 6, 2025

(54) ASYMMETRIC MEMORY CELL DESIGN

(71) Applicant: Micron Technology, Inc., Boise, ID (US)

(72) Inventors: Mattia Robustelli, Milan (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 17/818,923

(22) Filed: Aug. 10, 2022

(65) Prior Publication Data

US 2023/0354619 A1 Nov. 2, 2023

Related U.S. Application Data

(63) Continuation-in-part of application No. 17/733,474, filed on Apr. 29, 2022.

(51) Int. Cl.
*H10B 63/00* (2023.01)
*H10N 70/00* (2023.01)
*H10N 70/20* (2023.01)

(52) U.S. Cl.
CPC ......... *H10B 63/845* (2023.02); *H10N 70/066* (2023.02); *H10N 70/231* (2023.02); *H10N 70/841* (2023.02); *H10N 70/882* (2023.02)

(58) Field of Classification Search
CPC .... H10B 63/845; H10B 63/30; H10N 70/066; H10N 70/231; H10N 70/841; H10N 70/882; H10N 70/021; H10N 70/823
See application file for complete search history.

(56) References Cited

U.S. PATENT DOCUMENTS

| | | | |
|---|---|---|---|
| 9,595,567 B2 * | 3/2017 | Yamamoto | H10B 63/845 |
| 9,728,585 B1 | 8/2017 | Yamato et al. | |
| 10,693,065 B2 * | 6/2020 | Redaelli | H10N 70/24 |
| 10,847,578 B1 * | 11/2020 | Chen | H10N 70/063 |
| 2011/0147824 A1 | 6/2011 | Son et al. | |
| 2018/0102149 A1 | 4/2018 | Tortorelli et al. | |
| 2019/0043580 A1 | 2/2019 | Pirovano et al. | |
| 2019/0044062 A1 | 2/2019 | Fantini | |
| 2020/0075850 A1 | 3/2020 | Park et al. | |
| 2020/0243136 A1 | 7/2020 | Pirovano et al. | |
| 2022/0254997 A1 * | 8/2022 | Ahn | H10N 70/841 |
| 2023/0354615 A1 * | 11/2023 | Lee | H10N 70/066 |
| 2023/0380195 A1 * | 11/2023 | Yang | H10N 70/231 |

* cited by examiner

*Primary Examiner* — Allison Bernstein

(74) *Attorney, Agent, or Firm* — Holland & Hart LLP

(57) ABSTRACT

Methods, systems, and devices for asymmetric memory cell design are described. A memory device may implement a programming scheme that uses low programming pulses based on an asymmetric memory cell design. For example, the asymmetric memory cells may have electrodes with different contact areas (e.g., widths) and may accordingly be biased to a desired polarity (e.g., negative biased or positive biased) for programming operations. That is, the asymmetric memory cell design may enable an asymmetric read window budget. For example, an asymmetric memory cell may be polarity biased, supporting programming operations for logic states based on the polarity bias.

14 Claims, 20 Drawing Sheets

First Dielectric Material 515   Storage Material 535

First Conductive Material 520   Second Conductive Material 540

500-d

| | First Dielectric Material 515 |
| | First Conductive Material 520 |
| | Storage Material 535 |

| | First Dielectric Material 515 | | Storage Material 535 |
| | First Conductive Material 520 | | Second Conductive Material 540 |

First Dielectric Material 515      Storage Material 535

First Conductive Material 520      Second Conductive Material 540

First Dielectric Material 515      Second Conductive Material 540

First Conductive Material 520      Third Conductive Material 545

Storage Material 535

| | Substrate 1005 |
|---|---|
|  | Selector Device 1007 |
|  | First Dielectric Material 1015 |
|  | First Conductive Material 1020 |
|  | Second Conductive Material 1022 |

First Dielectric Material 1015
 Storage Material 1035
 First Conductive Material 1020
 Third Conductive Material 1040
 Second Conductive Material 1022

First Dielectric Material 1015
 Storage Material 1035
 First Conductive Material 1020
 Third Conductive Material 1040
 Second Conductive Material 1022
 Fourth Conductive Material 1045

| | | | |
|---|---|---|---|
|  | First Dielectric Material 1015 |  | Storage Material 1035 |
|  | First Conductive Material 1020 |  | Third Conductive Material 1040 |
|  | Second Conductive Material 1022 |  | Fourth Conductive Material 1045 |

1100

First Dielectric Material 1015

First Conductive Material 1020

Storage Material 1035

Second Conductive Material 1022

1200-a

First Dielectric Material 1015

First Conductive Material 1020

Second Conductive Material 1022

Storage Material 1035

Third Conductive Material 1040

Fourth Conductive Material 1045

1200-b

ASYMMETRIC MEMORY CELL DESIGN

CROSS REFERENCE

The present application for patent is a continuation-in-part of and claims priority to and the benefit of U.S. patent application Ser. No. 17/733,474 by ROBUSTELLI et al., entitled "IMPROVING WRITE LATENCY AND ENERGY USING ASYMMETRIC CELL DESIGN," filed Apr. 29, 2022, assigned to the assignee hereof, and expressly incorporated by reference herein.

FIELD OF TECHNOLOGY

The following relates to one or more systems for memory, including asymmetric memory cell design.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
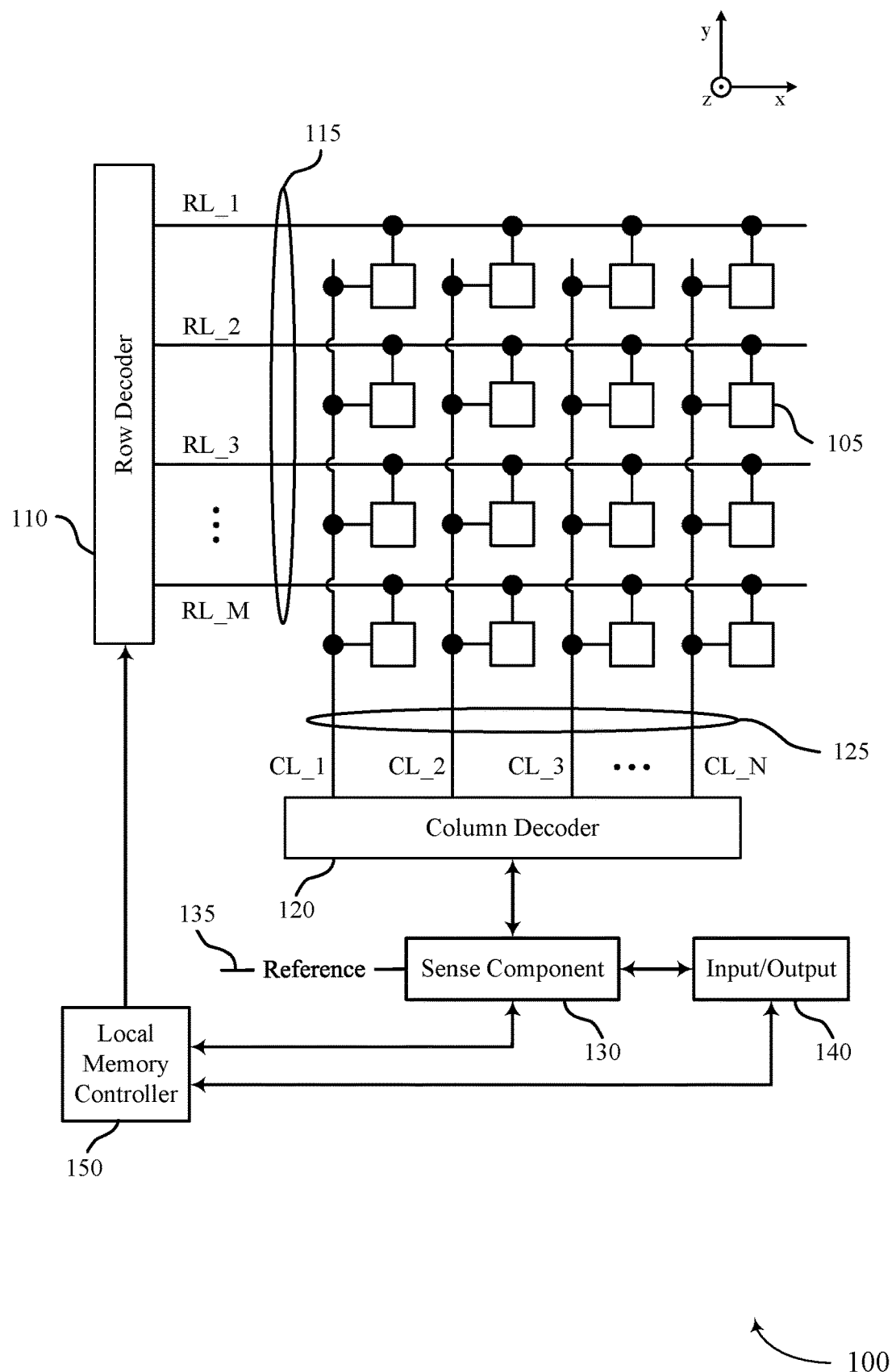
FIG. 1 illustrates an example of a memory array that supports asymmetric memory cell design in accordance with examples as disclosed herein.

A memory device may include multiple memory arrays of memory cells (e.g., a partition including multiple memory tiles) and may perform programming operations (e.g., access operations, including write operations). That is, the memory device may apply a voltage (e.g., a write voltage) to the memory arrays via one or more access lines (e.g., a word line or a bit/digit line) to write a logic state, such as a first logic state or a second logic state, to one or more memory cells. The memory device may write a logic state to each memory cell based on characteristics of the applied voltage. For example, the memory device may write a first logic state to a memory cell by applying a positive voltage across the memory cell and may write a second logic state to a memory cell by applying a negative voltage across the memory cell.

Applying a voltage across the memory cell may set a threshold voltage state of the memory cell, such that the logic state may be determined based on whether an applied voltage exceeds a threshold voltage of the memory cell causing current to run through the memory cell. In some cases, this phenomenon may be described as a snap-back event or thresholding the memory cell. If the applied voltage induces a current through the memory cell, the memory device may determine that the memory cell is storing the second logic state. Additionally, if the applied voltage does not induce a current through the memory cell, the memory device may determine that the memory cell is storing a first logic state.

In some examples, the threshold voltage of one or more memory cells in the memory arrays may drift (e.g., increase or decrease) over time. For example, electrical characteristics of a memory cell (e.g., resistivity of the memory cell) may change after repeated programming operations are performed on the memory cell resulting in the drift in threshold voltage. In some cases, a memory device may be configured to "cancel" or "offset" drift that has occurred in any one memory cell. That is, the memory device may be configured to lower the threshold voltage of the memory cell having experienced drift. If a cell was previously programmed to a first logic state, it may have drifted over time. Accordingly, it may be difficult to program the memory cell to the second logic state. However, performing a drift cancellation operation may cancel the drift that occurred so that programming a second logic state to the memory cell will be successful. Additionally, or alternatively, performing a drift cancellation operation may identify the logic states stored to certain memory cells. For example, if a cell does not snap when performing a drift cancellation operation then it may already be programmed to the desired state.

To cancel the drift of a memory cell (e.g., to lower its threshold voltage), the memory device may apply a voltage to the cell that corresponds to a logic state that was written to the cell during a prior programming operation. For example, if a first logic state was written during a prior programming operation (e.g., using a positive programming voltage), then a positive voltage may be applied to the cell to cancel or mitigate any drift that may have occurred.

In some instances, a logic state may be written to a memory cell after a drift cancellation operation. For example, a positive voltage may be applied to a memory cell to cancel drift that may have occurred and a negative voltage may then be applied to the memory cell during a write operation. The voltages applied to access lines may toggle one or more times between positive and negative for drift cancellation purposes and to perform programming operations. But the toggling of the word line may consume time and power, which may be undesirable.

In accordance with examples as disclosed herein, a memory device may implement a programming scheme that uses low programming pulses based on an asymmetric memory cell design. For example, the asymmetric memory cells may have electrodes with different contact areas (e.g., widths) and may accordingly be biased to a desired polarity (e.g., negative biased or positive biased) for programming operations. That is, an asymmetric memory cell design, including those described herein, may enable an asymmetric read window budget (RWB). For example, an asymmetric memory cell may be polarity biased, and may support programming operations for logic states based on the polarity bias. Implementing the asymmetric memory cells supporting the asymmetric RWB enables the memory device to use fewer programming pulses, which increases programming speed and decreases system latency. Additionally, the asymmetric cell designs enable the memory device to use lower programming pulses, which reduces resource consumption during programming operations.

Features of the disclosure are initially described in the context of memory devices and arrays with reference to FIGS. 1, 2, 3A, and 3B. Features of the disclosure are described in the context of improving write latency and energy using asymmetric cell design with reference to FIGS. 4A, 4B, and 5A-5E. These and other features of the disclosure are further illustrated by and described with reference to an apparatus diagram and flowcharts that relate to improving write latency and energy using asymmetric cell design as described with reference to FIGS. 6-9. Further features of the disclosure are described in the context of manufacturing steps of process flows with reference to FIGS. 10A-10F, 11, 12A, 12B, and 13A-13C. These and other features of the disclosure are further illustrated by and described with reference to a flowchart that relates to asymmetric cell design as described with reference to FIG. 14.

FIG. 1 illustrates an example of a memory device 100 that supports asymmetric memory cell design in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In accordance with examples as disclosed herein, the memory device 100 may implement a programming scheme that uses low programming pulses (e.g., pulses applied via the row lines 115 or the column lines 125 to program the memory cells 105) based on an asymmetric design for the memory cells 105. For example, the asymmetric memory cells 105 may have electrodes with different contact areas (e.g., widths) and may accordingly be biased to a desired polarity (e.g., negative biased or positive biased) for programming operations. That is, the asymmetric memory cell design may enable an asymmetric RWB. For example, an asymmetric memory cell 105 may be polarity biased, supporting programming operations for logic states based on the polarity bias. Implementing the asymmetric memory cells 105 supporting the asymmetric RWB enables the memory device 100 to use fewer programming pulses, increasing programming speed and decreasing system latency. Additionally, the asymmetric cell design enable the memory device 100 to use lower programming pulses, reducing resource consumption during programming operations.

The memory device 100 may include any quantity of non-transitory computer readable media that support improving write latency and energy using asymmetric cell design. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
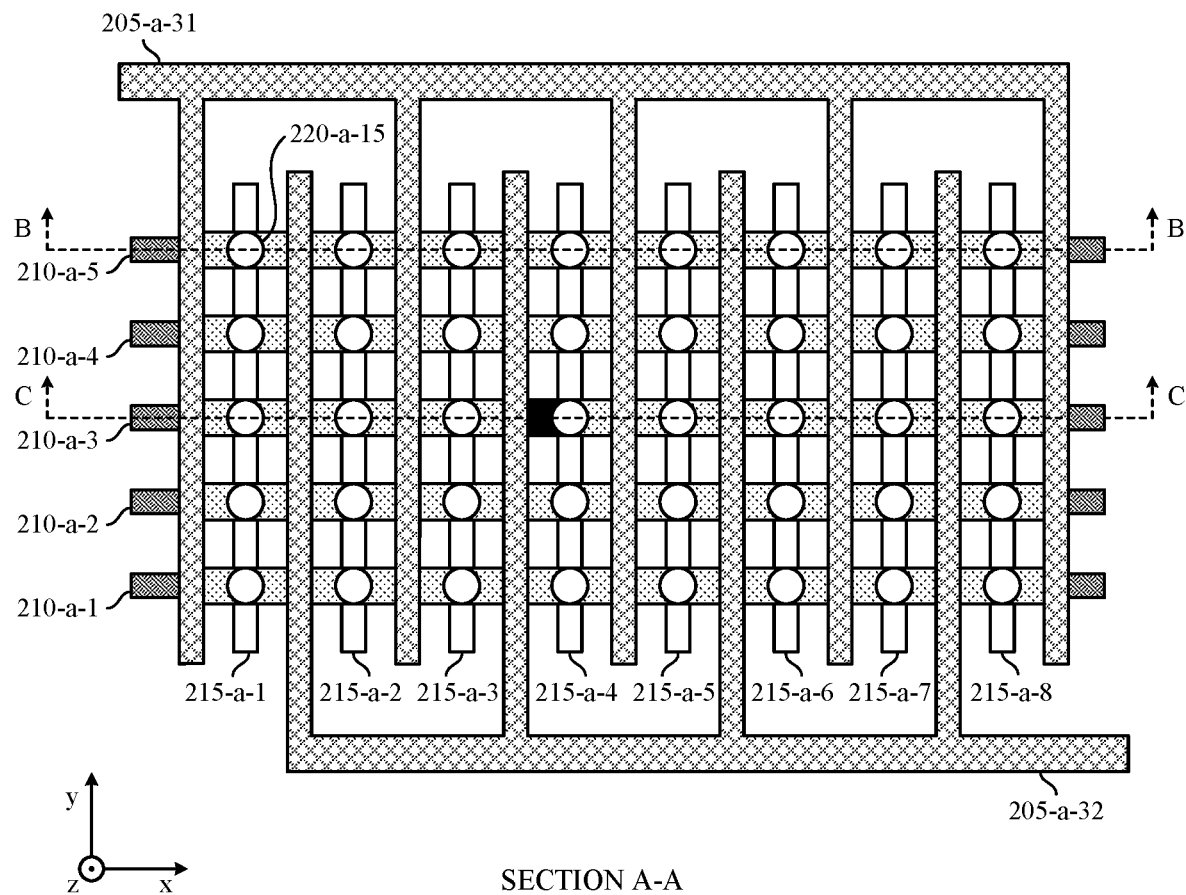
FIG. 2 illustrates a top view of an example of a memory array that supports asymmetric memory cell design in accordance with examples as disclosed herein.
Figure 3A:
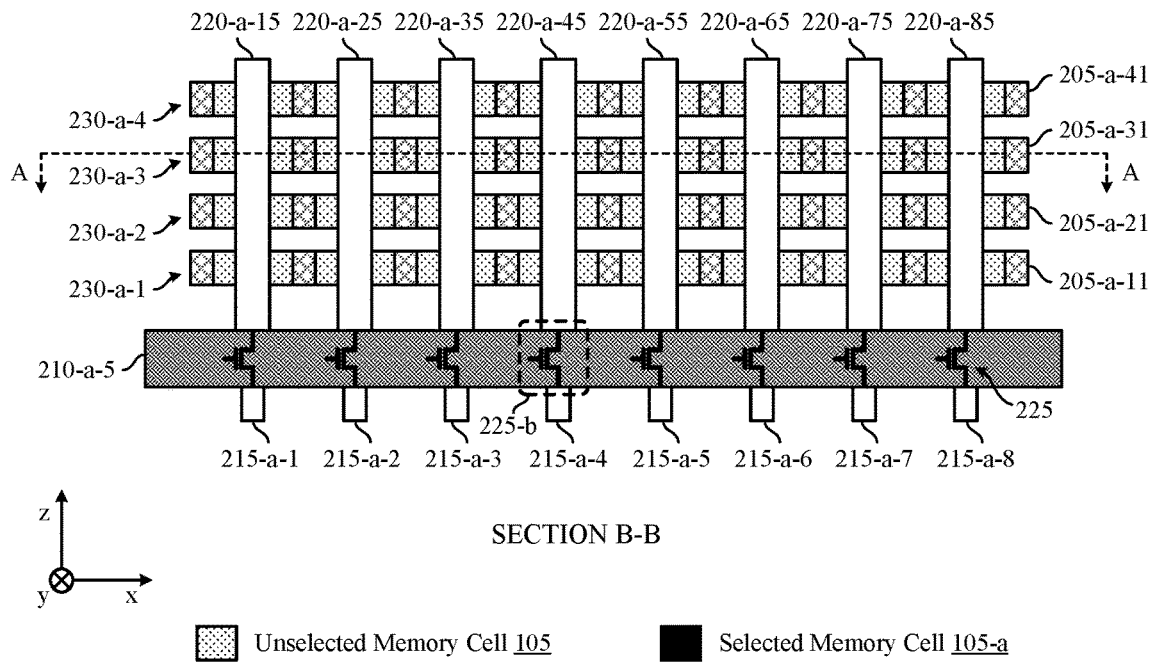
FIGS. 3A and 3B illustrate side views of an example of a memory array that supports asymmetric memory cell design in accordance with examples as disclosed herein.
Figure 3B:
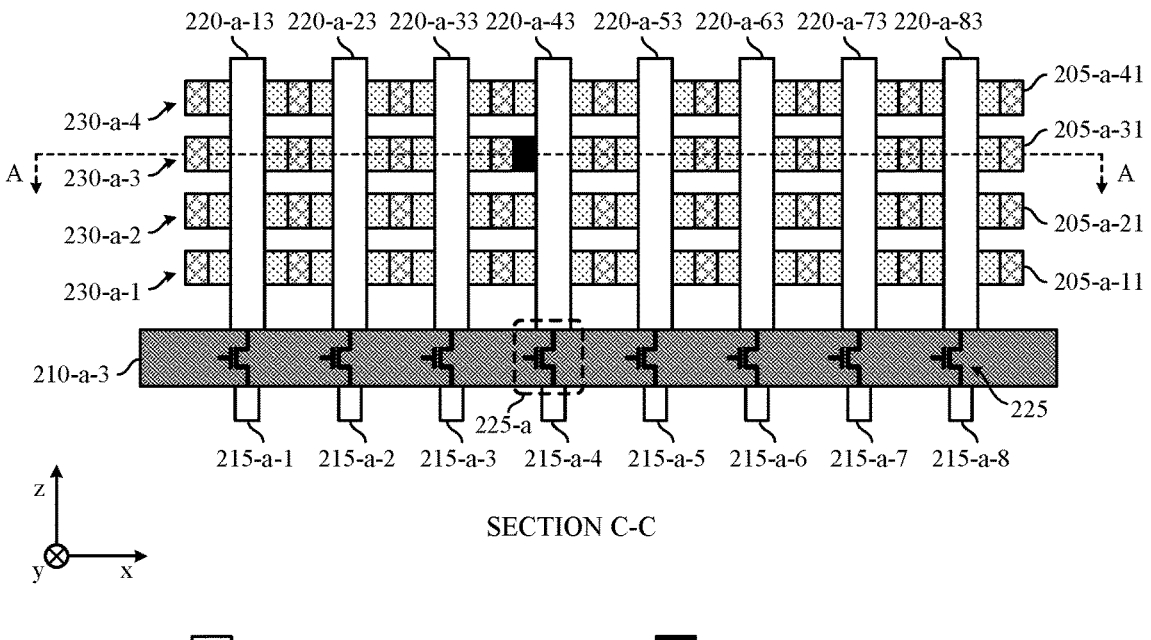

FIGS. 2, 3A, and 3B illustrate an example of a memory array 200 that supports asymmetric memory cell design in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200 may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the sense line 215-a-4 from the pillar 220-a-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 1) to threshold (e.g., permit a current flow, permit a current above a threshold current), and may not cause a memory cell 105 storing a second logic state (e.g., a logic 0) to threshold (e.g., may not permit a current flow, may permit a current below a threshold current).

In some cases, the memory device 100 may include the array of memory cells 105 to store data for a host device. In some cases, the memory device 100 may perform a programming operation (e.g., a write operation) on the memory cells 105 based on a command from a host device. In such cases, the memory device may drive a voltage through an access line (e.g., such as word line 205) coupled with a set of memory cells 105 to perform the programming operation on the set of memory cells 105. In some examples, the voltage may be compared to a threshold voltage of a memory cell 105 to determine a logic state of the memory cell 105. However, in such examples, the threshold voltage may "drift" (e.g., shift) after repeated programming voltages are applied to the memory cell 105 or a duration elapses at the memory cell 105. Drift may negatively affect the memory device's ability to accurately perform programming operations on the memory cell 105. Therefore, drift cancellation procedures may be implemented on a memory array to prevent the effects of drift.

In accordance with examples as disclosed herein, the memory array 200 may implement a programming scheme that uses low programming pulses (e.g., pulses applied via access lines to program the memory cells 105) based on an asymmetric design for the memory cells 105. For example, the asymmetric memory cells 105 may have electrodes with different contact areas (e.g., widths) and may accordingly be biased to a desired polarity (e.g., negative biased or positive biased) for programming operations. That is, the asymmetric memory cell design may enable an asymmetric RWB. For example, an asymmetric memory cell 105 may be polarity biased, supporting programming operations for logic states based on the polarity bias. Implementing the asymmetric memory cells 105 supporting the asymmetric RWB enables the memory array 200 to use fewer programming pulses, increasing programming speed and decreasing system latency. Additionally, the asymmetric cell design enable the memory array 200 to use lower programming pulses, reducing resource consumption during programming operations.

Figure 4A:
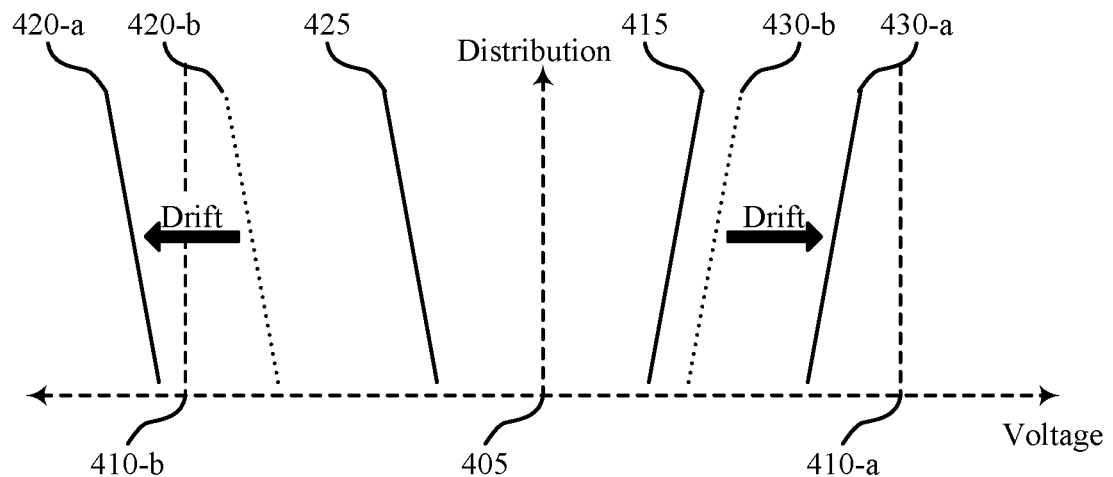
FIGS. 4A and 4B illustrate examples of programming diagrams that support asymmetric memory cell design in accordance with examples as disclosed herein.
Figure 4B:
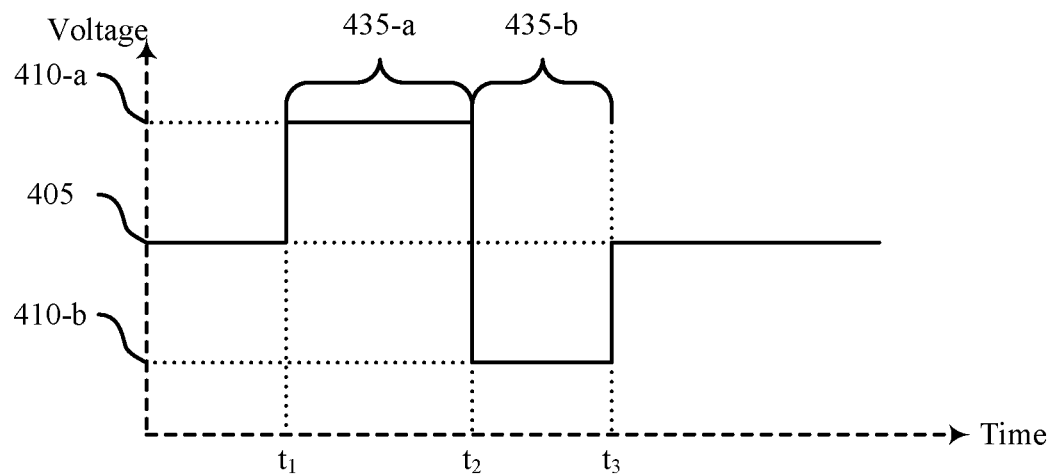

FIGS. 4A and 4B illustrate examples of programming diagrams 400 that support asymmetric memory cell design in accordance with examples as disclosed herein. The programming diagram 400-*a* may illustrate voltages associated with a programming operation performed on asymmetric memory cells as described with reference to FIGS. 2, 3A, and 3B. Additionally, the programming diagram 400-*a* may implement aspects of the memory device 100 as described with reference to FIG. 1.

The programming diagram 400-*a* may be an example diagram of threshold voltages used to determine logic states stored in the memory cells. A horizontal axis of the programming diagram 400-*a* may indicate a voltage applied to the memory cells during a programming operation, and a vertical axis may represent a quantile of distribution (e.g., a percentage) based on the applied voltage. Further, a voltage 405 may symbolize a zero voltage (e.g., no voltage applied to the memory cells). In some implementations, a selection voltage 410-*a* (e.g., a positive selection voltage, which may be referred to as $+V_{sel\_dc}$) may be an example of a first voltage (e.g., a first programming pulse) applied to the asymmetric memory cells, and a selection voltage 410-*b* (e.g., a negative selection voltage, which may be referred to as $-V_{sel\_dc}$) may be an example of a second voltage (e.g., a second programming pulse) applied to the asymmetric memory cells to cancel drift and to write logic states to the asymmetric memory cells during a programming operation.

The programming diagram 400-*a* is an example programming operation scheme for one or more asymmetric memory cells that have an improved RWB for voltages with a negative polarity (e.g., a read bias may be negative). However, the programming diagram 400-*a* may be different in the case of a programming operation performed on one or more asymmetric memory cells that have an improved RWB for voltages with a positive polarity (e.g., a read bias may be positive). The one or more asymmetric memory cells may be negatively or positively biased based at least in part on the asymmetry in the design of the asymmetric memory cells. For example, the asymmetric memory cells may be designed with a preferred polarity for the RWB based on the manufacturing process used to form the asymmetric memory cells.

In some examples, threshold voltages 415 and 420-*b* may be used to determine a first logic state (e.g., "0") stored in the asymmetric memory cells. Similarly, threshold voltages 425 and 430-*a* may be used to determine a second logic state (e.g., "1") stored in the asymmetric memory cells. Further, the threshold voltages 420-*a* and 430-*a* may be used after accounting for voltage drift at the asymmetric memory cells. In some implementations, threshold voltages 420-*b* and 430-*b* may be used to determine the logic states associated with the threshold voltages 420-*a* and 430-*a* prior to drift cancellation.

The programming operation may drive one or more asymmetric memory cells at least to a threshold voltage to program the logic state at the asymmetric memory cells. For example, to program the first logic state at the one or more asymmetric memory cells, the memory device may apply a voltage greater in magnitude than the threshold voltage 415 to the asymmetric memory cells, such as the selection voltage 410-*a*. Similarly, to program the second logic state at the one or more asymmetric memory cells, the memory device may apply a voltage greater in magnitude than the threshold voltage 425 to the asymmetric memory cells, such as the selection voltage 410-*b*.

The programming diagram 400-*a* may differ from other different programming operations due to the asymmetric design of the memory cells. For example, in the programming diagram 400-*a*, the threshold voltages 430-*a* and 430-*b* each have a magnitude less than the magnitude of the threshold voltage 415. That is, the memory device may perform program operations without canceling the drift from the threshold voltage 430-*b* to the threshold voltage 430-*a*. Accordingly, the programming diagram 400-*a* may have advantages over other different programming operations by having a shorter write completion time, lower resource requirements, and fewer pulses and polarity flips.

As illustrated in FIG. 4B the programming diagram 400-*b* may implement aspects of the programming diagram 400-*a*, such as the zero voltage 405 and the selection voltages 410-*a* and 410-*b* described with reference to FIG. 4A. The programming diagram 400-*b* may represent a timing associated with applying the voltages to one or more asymmetric memory cells of a set of asymmetric memory cells as demonstrated in the programming diagram 400-*a*. The horizontal axis of the programming diagram 400-*b* may represent time and the vertical axis may represent the voltage applied to the one or more asymmetric memory cells. A logic state may be programmed to the asymmetric memory cells and remain until another voltage is applied (e.g., a programming pulse).

Prior to a time $t_1$, the memory device may receive a command to write the first logic state (e.g., "0") to a first subset of the set of memory cells and the second logic state (e.g., "1") to a second subset of the set of memory cells. Prior to the time $t_1$, the memory device may not apply a voltage to the set of asymmetric memory cells, and the logic state stored in each of the set of asymmetric memory cells may be based on a prior logic state programmed to each asymmetric memory cell.

At the time $t_1$, the memory device may apply the positive selection voltage 410-*a* to the set of asymmetric memory cells. Applying the selection voltage 410-*a* for a duration 435-*a* between the time $t_1$ and a time $t_2$ may program the logic state of the asymmetric memory cells to the first logic state. That is, applying the selection voltage 410-*a* may write the first logic state to memory cells of the first subset of the set of asymmetric memory cells. Applying the selection voltage 410-*a* may additionally cancel a drift in one or more asymmetric memory cells of the second subset. For example, the one or more asymmetric memory cells of the second subset may store the first logic state, and applying the selection voltage 410-*a* may refresh the first logic state stored in the one or more asymmetric memory cells.

At the time $t_2$, the memory device may apply the negative selection voltage 410-*b* to the second subset of the set of asymmetric memory cells. That is, at the time $t_2$, a polarity of the applied voltage may flip. Applying the selection voltage 410-*b* for a duration 435-*b* between the time $t_2$ and a time $t_3$ may write the second logic state to memory cells of the second subset of the set of asymmetric memory cells. The duration 435-*b* may be equal to or different than the duration 435-*a*. In some examples, a sum of the durations 435-*a* and 435-*b* may be less than a sum of three durations used to cancel a drift and program a set of memory cells that do not include the asymmetric design.

At the time $t_3$, the memory device may cease applying a voltage to the set of asymmetric memory cells. That is, after the time $t_3$, the zero voltage 405 may be applied to the asymmetric memory cells, for example, until another command is received to initiate a subsequent programming operation.

FIGS. 5A through 5E illustrate examples of processing steps 500 that support asymmetric memory cell design in accordance with examples as disclosed herein. The processing steps illustrate various cross-sectional views of materials on a substrate 505. The processing steps 500 may implement aspects of the memory device 100 as described with reference to FIG. 1.

Figure 5A:
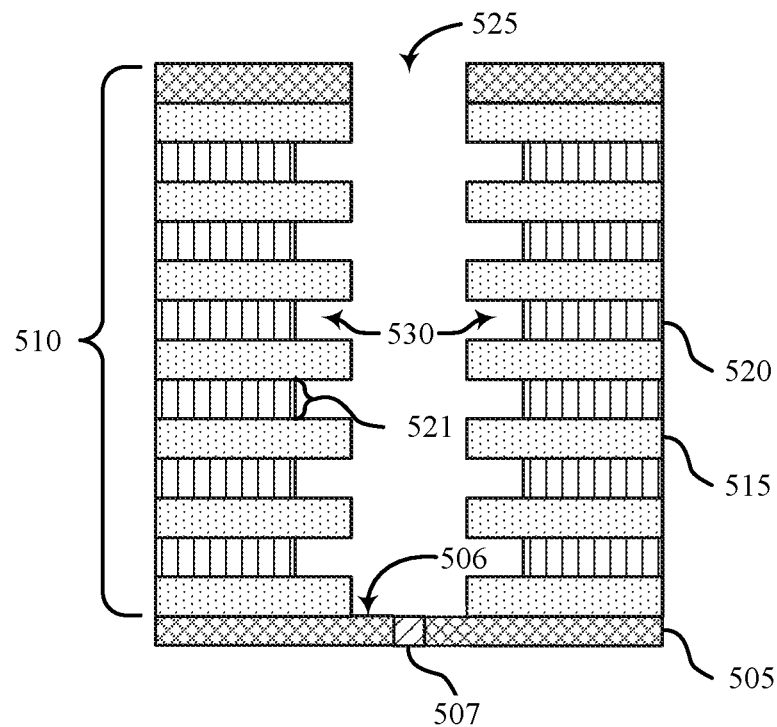
FIGS. 5A through 5E illustrate manufacturing steps of a process flow that supports asymmetric memory cell design in accordance with examples as disclosed herein.

In FIG. 5A, processing step 500-a is depicted and includes a cross-sectional view of the memory architecture of a memory device before memory cell deposition. In the processing step 500-a, a stack 510 of materials may be formed on the substrate 505. The stack 510 may include a first dielectric material 515 and a first conductive material 520 in alternating layers. The first conductive material 520 may include carbon, tungsten, or a combination thereof. In some examples, the layers of the first conductive material 520 may be directly deposited in alternating layers with the first dielectric material 515. Additionally, or alternatively, alternating layers of the first dielectric material 515 and an insulating material (e.g., nitride) may be deposited, and the insulating material may be removed (e.g., etched, exhumed) to form voids in which the first conductive material 520 may be deposited to form the stack 510.

Any quantity of dielectric and conductive layers may be layered based on a desired height of the vertical stack of memory cells. The stack 510 of materials (e.g., first dielectric material 515 and first conductive material 520) may be etched to form a cavity 525 and, in some examples, expose a surface 506 of the substrate 505 in the cavity 525. In some cases, the substrate 505 may be etched to form the cavity 525 and a selector device 507 (e.g., a thin film transistor) may be deposited into the cavity 525. Portions of the first conductive material 520 may be etched to form recesses 530 between the alternating layers of the first dielectric material 515. In some cases, the etched portions of the first conductive material 520 may form a set of first electrodes in the recesses 530. In some cases, the first electrodes may have a first contact area 521 and may be coupled with a first access line decoder.

Figure 5B:
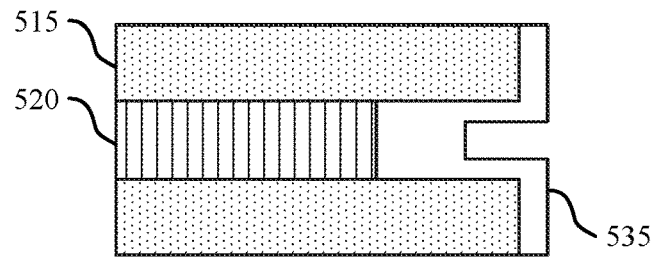

In FIG. 5B, processing step 500-b is depicted and includes a cross-sectional view of the memory architecture of the memory device. In the processing step 500-b, a storage material 535 may be deposited into the recesses 530 to form storage elements. In some cases, the storage material 535 may be a chalcogenide material. In some cases, the storage material 535 may be deposited into the recesses 530 such that a portion of the recesses 530 remains unfilled. For example, an outer surface of the storage material 535 may not be coplanar with an outer surface of the first dielectric material 515. Additionally, or alternatively, the storage material 535 may be deposited into the recesses 530 and additional storage material 535 may be deposited on the surrounding dielectric material 515 above and below the recesses 530, as shown in the cross sectional view of FIG. 5B. In some cases, the storage elements may be coupled with the first electrodes. In some examples, the storage material 535 may be conformally deposited such that a thickness of the storage material 535 on each sidewall surrounding the recesses 530 (including the sidewall coupled with the first electrode) is substantially the same.

Figure 5C:
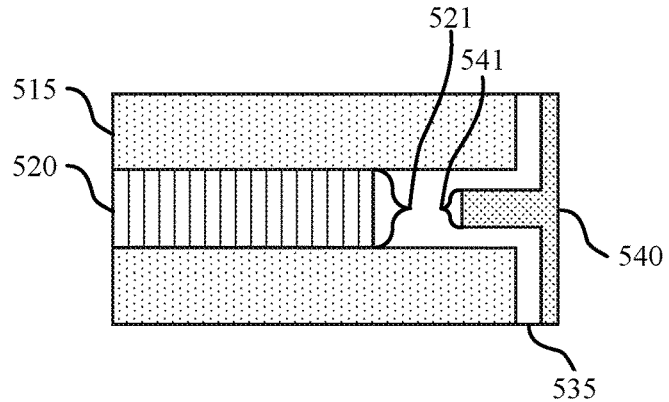

In FIG. 5C, processing step 500-c is depicted and includes a cross-sectional view of the memory architecture of the memory device. In the processing step 500-c, a second conductive material 540 may be deposited into the recesses 530 to form a set of second electrodes. The second conductive material 540 may include carbon, tungsten, or a combination thereof. In some cases, each second electrode may have a second contact area 541 with different dimensions (e.g., a different width in a first direction, a different height in a second direction, or both) than the first contact area 521 of the first electrode. In some cases, the second conductive material 540 may be deposited to fill the recesses 530. In some examples, additional second conductive material 540 may be deposited on the surrounding dielectric material 515, such that a surface of the conductive material 540 may be coplanar with the outer surface of the dielectric material 515. In some examples, the additional second conductive material 540 may be deposited on the additional storage material 535 deposited on the surrounding dielectric material 515, as shown in the cross sectional view of FIG. 5C.

Figure 5D:
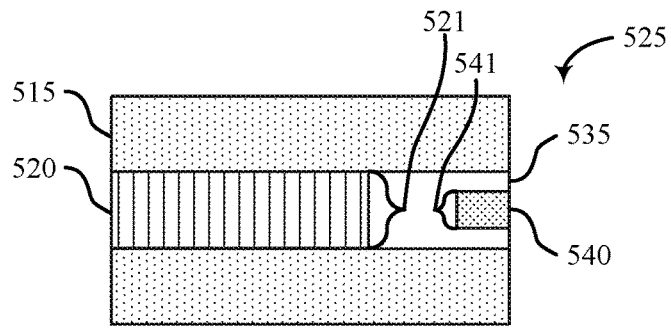
Figure 5D:
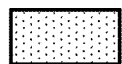
Figure 5D:
Figure 5D:
Figure 5D:

In FIG. 5D, processing step 500-d is depicted and includes a cross-sectional view of the memory architecture of the memory device. In the processing step 500-d, the second conductive material 540 and the storage material 535 may be etched to reform the cavity 525. In some examples, etching the second conductive material 540 and the storage material 535 may expose portions of the dielectric material 515, the second conductive material 540, or the storage material 535. In some cases, the outer surfaces of the dielectric material 515, the second conductive material 540, and the storage material 535 may be coplanar, as shown in the cross-sectional view of FIG. 5D.

Figure 5E:
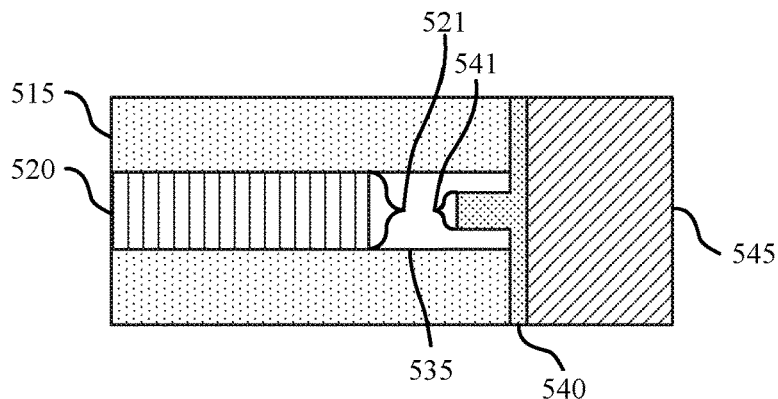
Figure 5E:
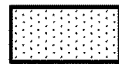
Figure 5E:
Figure 5E:
Figure 5E:
Figure 5E:

In FIG. 5E, processing step 500-e is depicted and includes a cross-sectional view of the memory architecture of the memory device. In the processing step 500-e, the second conductive material 540 may be deposited in the reformed cavity 525. In some cases, depositing the second conductive material 540 in the reformed cavity 525 may include depositing the second conductive material 540 on the outer surfaces of the dielectric material 515, the second conductive material 540, and the storage material 535. Additionally, in the processing step 500-e, a third conductive material 545 (e.g., carbon, tungsten, or both) may be deposited on the second conductive material 540 deposited in the processing step 500-e, as shown in the cross-sectional view of FIG. 5E. In some cases, the third conductive material 545 may be coupled with a second access line decoder.

Figure 6:
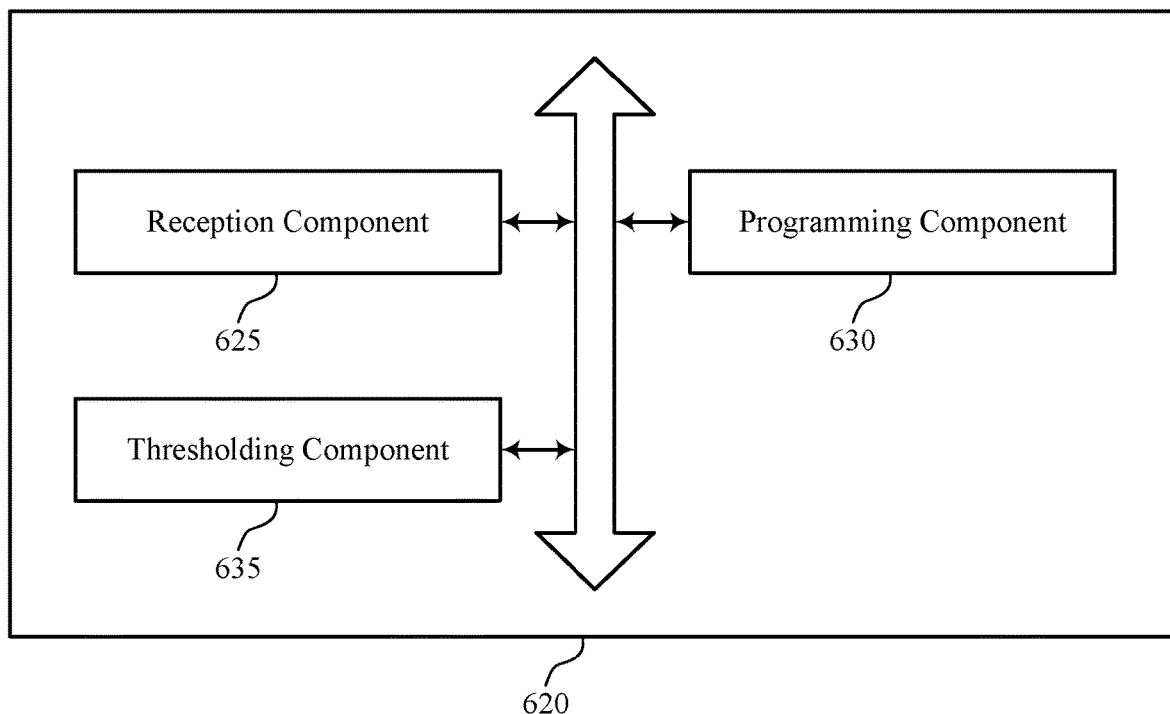
FIG. 6 shows a block diagram of a memory device that supports asymmetric memory cell design in accordance with examples as disclosed herein.

FIG. 6 shows a block diagram 600 of a memory device 620 that supports asymmetric memory cell design in accordance with examples as disclosed herein. The memory device 620 may be an example of aspects of a memory device as described with reference to FIGS. 1, 2, 3A, 3B, 4A, 4B, and 5A through 5E. The memory device 620, or various components thereof, may be an example of means for performing various aspects of improving write latency and energy using asymmetric cell design as described herein. For example, the memory device 620 may include a reception component 625, a programming component 630, a thresholding component 635, or any combination thereof. Each of these components may communicate, directly or indirectly, with one another (e.g., via one or more buses).

The reception component 625 may be configured as or otherwise support a means for receiving, at a memory device, a command to write a first logic state to a first subset of a set of memory cells and a second logic state to a second subset of the set of memory cells, where each memory cell of the set of memory cells is coupled with a first access line via a first electrode having a first contact area and is coupled with a respective second access line via a second electrode having a second contact area different than the first contact area. The programming component 630 may be configured as or otherwise support a means for applying, during a first duration and in response to the command, a first voltage to the first access line, where, during the first duration, at least one memory cell of the second subset thresholds and at least one memory cell of the first subset is written to the first logic state based at least in part on applying the first voltage to the first access line, the thresholding based at least in part on the second contact area being different than the first contact area. In some examples, the programming component 630 may be configured as or otherwise support a means for applying, during a second duration after the first duration and in response to the command, a second voltage to the first access line, where, during the second duration, the at least one memory cell of the second subset is written to the second logic state based at least in part on applying the second voltage to the first access line.

In some examples, the programming component 630 may be configured as or otherwise support a means for applying, during the first duration, a third voltage to a second access line coupled with the at least one memory cell of the first subset, where the at least one memory cell of the first subset is written to the first logic state based at least in part on applying the third voltage to the second access line.

In some examples, the programming component 630 may be configured as or otherwise support a means for applying, during the first duration, the third voltage to a second access line coupled with the at least one memory cell of the second subset, where the at least one memory cell of the second subset thresholds based at least in part on applying the third voltage to the second access line coupled with the at least one memory cell of the second subset.

In some examples, the programming component 630 may be configured as or otherwise support a means for applying, during the second duration after the first duration, a fourth voltage to a second access line coupled with the at least one memory cell of the second subset, where the at least one memory cell of the second subset is written to the second logic state based at least in part on applying the fourth voltage to the second access line.

In some examples, the third voltage has a first polarity and the fourth voltage has a second polarity different than the first polarity.

In some examples, during the first duration, the at least one memory cell of the second subset thresholds based at least in part on a prior logic state written to the at least one memory cell of the second subset.

In some examples, the first voltage has a first polarity and the second voltage has a second polarity different than the first polarity.

In some examples, a magnitude of the first voltage and a magnitude of the second voltage have a same magnitude.

In some examples, a first magnitude of a first threshold voltage associated with the first logic state is different than a second magnitude of a second threshold voltage associated with the second logic state based at least in part on the second contact area being different than the first contact area.

In some examples, the second magnitude is less than the first magnitude.

In some examples, a magnitude of the first voltage is greater than the second magnitude. In some examples, a magnitude of the second voltage is less than the first magnitude.

In some examples, each memory cell of the set of memory cells includes a chalcogenide material.

In some examples, the programming component 630 may be configured as or otherwise support a means for writing, during a first portion of an access operation, a first logic state to memory cells of a first subset of a set of memory cells, where each memory cell of the set of memory cells is coupled with a first access line via a first electrode having a first contact area and is coupled with a respective second access line via a second electrode having a second contact area different than the first contact area. The thresholding component 635 may be configured as or otherwise support a means for thresholding, during the first portion of an access operation and concurrent with writing the first logic state to the first subset, memory cells of a second subset of the set of memory cells, the thresholding based at least in part on the second contact area being different than the first contact area. In some examples, the programming component 630 may be configured as or otherwise support a means for writing, during a second portion of the access operation, a second logic state to the memory cells of the second subset based at least in part on the thresholding.

In some examples, the writing the first logic state to the memory cells of the first subset and, to support thresholding the memory cells of the second subset, the programming component 630 may be configured as or otherwise support a means for applying a first programming pulse to the set of memory cells during the first portion of the access operation, where the first programming pulse has a first polarity.

In some examples, the first programming pulse is applied to the first access line.

In some examples, to support writing the second logic state to the memory cells of the second subset, the programming component 630 may be configured as or otherwise support a means for applying a second programming pulse to the set of memory cells during the second portion of the access operation, where the second programming pulse has a second polarity that is different than the first polarity.

In some examples, the second programming pulse is applied to the first access line.

In some examples, the thresholding is further based at least in part on a logic state written to the memory cells of the second subset during a prior access operation.

In some examples, each memory cell of the set of memory cells includes a chalcogenide material.

Figure 7:
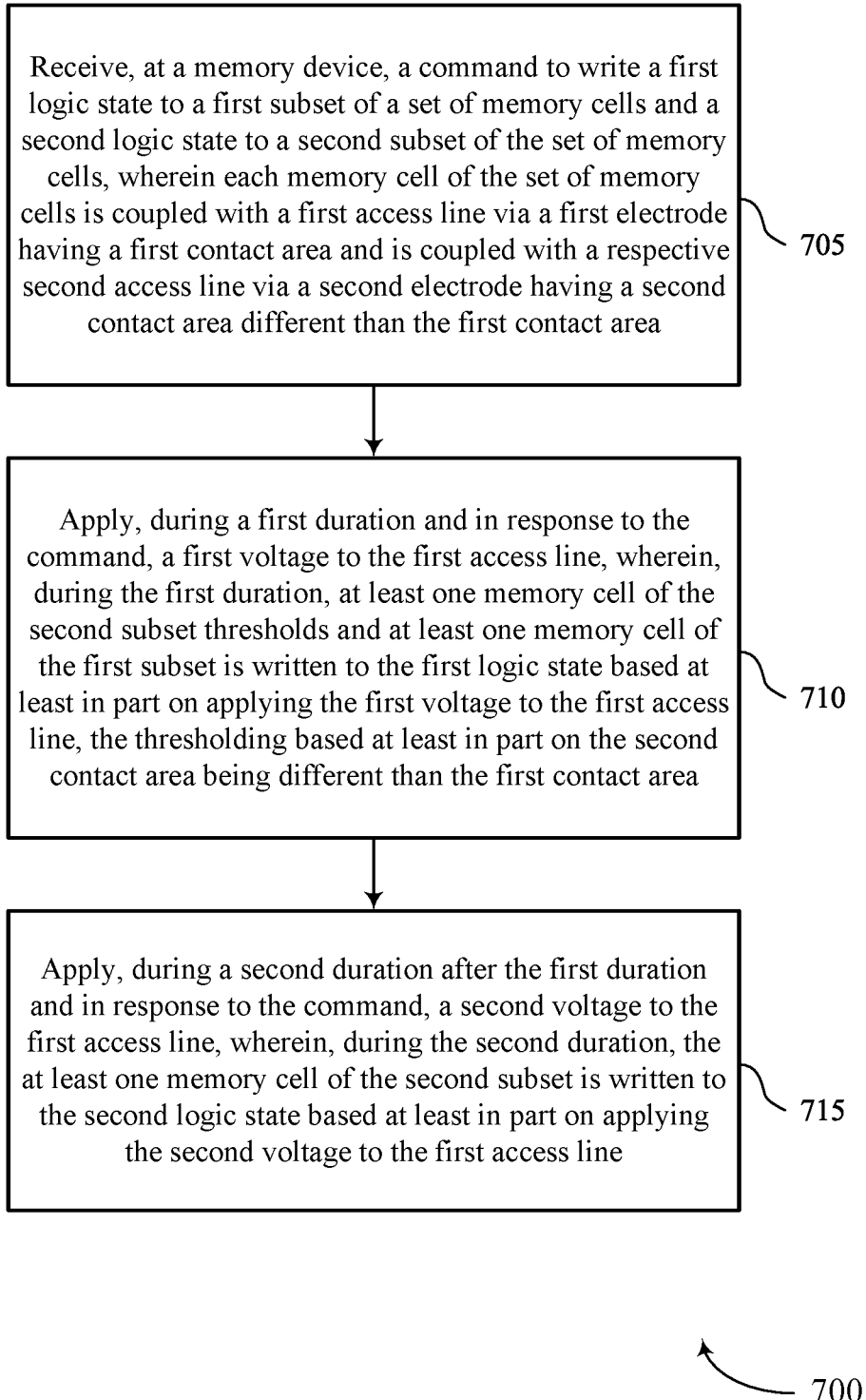
FIGS. 7 through 9 show flowcharts illustrating a method or methods that support asymmetric memory cell design in accordance with examples as disclosed herein.

FIG. 7 shows a flowchart illustrating a method 700 that supports asymmetric memory cell design in accordance with examples as disclosed herein. The operations of method 700 may be implemented by a memory device or its components as described herein. For example, the operations of method 700 may be performed by a memory device as described with reference to FIGS. 1, 2, 3A, 3B, 4A, 4B, 5A through 5E, and 6. In some examples, a memory device may execute a set of instructions to control the functional elements of the device to perform the described functions. Additionally, or alternatively, the memory device may perform aspects of the described functions using special-purpose hardware.

At 705, the method may include receiving, at a memory device, a command to write a first logic state to a first subset of a set of memory cells and a second logic state to a second subset of the set of memory cells, where each memory cell of the set of memory cells is coupled with a first access line via a first electrode having a first contact area and is coupled with a respective second access line via a second electrode having a second contact area different than the first contact area. The operations of 705 may be performed in accordance with examples as disclosed herein. In some examples, aspects of the operations of 705 may be performed by a reception component 625 as described with reference to FIG. 6.

At 710, the method may include applying, during a first duration and in response to the command, a first voltage to the first access line, where, during the first duration, at least one memory cell of the second subset thresholds and at least one memory cell of the first subset is written to the first logic state based at least in part on applying the first voltage to the first access line, the thresholding based at least in part on the second contact area being different than the first contact area. The operations of 710 may be performed in accordance with examples as disclosed herein. In some examples, aspects of the operations of 710 may be performed by a programming component 630 as described with reference to FIG. 6.

At 715, the method may include applying, during a second duration after the first duration and in response to the command, a second voltage to the first access line, where, during the second duration, the at least one memory cell of the second subset is written to the second logic state based at least in part on applying the second voltage to the first access line. The operations of 715 may be performed in accordance with examples as disclosed herein. In some examples, aspects of the operations of 715 may be performed by a programming component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory device, a command to write a first logic state to a first subset of a set of memory cells and a second logic state to a second subset of the set of memory cells, where each memory cell of the set of memory cells is coupled with a first access line via a first electrode having a first contact area and is coupled with a respective second access line via a second electrode having a second contact area different than the first contact area; applying, during a first duration and in response to the command, a first voltage to the first access line, where, during the first duration, at least one memory cell of the second subset thresholds and at least one memory cell of the first subset is written to the first logic state based at least in part on applying the first voltage to the first access line, the thresholding based at least in part on the second contact area being different than the first contact area; and applying, during a second duration after the first duration and in response to the command, a second voltage to the first access line, where, during the second duration, the at least one memory cell of the second subset is written to the second logic state based at least in part on applying the second voltage to the first access line.

Aspect 2: The method, apparatus, or non-transitory computer-readable medium of aspect 1, further including operations, features, circuitry, logic, means, or instructions, or any combination thereof for applying, during the first duration, a third voltage to a second access line coupled with the at least one memory cell of the first subset, where the at least one memory cell of the first subset is written to the first logic state based at least in part on applying the third voltage to the second access line.

Aspect 3: The method, apparatus, or non-transitory computer-readable medium of aspect 2, further including operations, features, circuitry, logic, means, or instructions, or any combination thereof for applying, during the first duration, the third voltage to a second access line coupled with the at least one memory cell of the second subset, wherein the at least one memory cell of the second subset thresholds based at least in part on applying the third voltage to the second access line coupled with the at least one memory cell of the second subset.

Aspect 4: The method, apparatus, or non-transitory computer-readable medium of aspect 2, further including operations, features, circuitry, logic, means, or instructions, or any combination thereof for applying, during the second duration after the first duration, a fourth voltage to a second access line coupled with the at least one memory cell of the second subset, where the at least one memory cell of the second subset is written to the second logic state based at least in part on applying the fourth voltage to the second access line.

Aspect 5: The method, apparatus, or non-transitory computer-readable medium of aspect 4 where the third voltage has a first polarity and the fourth voltage has a second polarity different than the first polarity.

Aspect 6: The method, apparatus, or non-transitory computer-readable medium of any of aspects 1 through 5 where during the first duration, the at least one memory cell of the second subset thresholds based at least in part on a prior logic state written to the at least one memory cell of the second subset.

Aspect 7: The method, apparatus, or non-transitory computer-readable medium of any of aspects 1 through 6 where the first voltage has a first polarity and the second voltage has a second polarity different than the first polarity.

Aspect 8: The method, apparatus, or non-transitory computer-readable medium of any of aspects 1 through 7 where a magnitude of the first voltage and a magnitude of the second voltage have a same magnitude.

Aspect 9: The method, apparatus, or non-transitory computer-readable medium of any of aspects 1 through 8 where a first magnitude of a first threshold voltage associated with the first logic state is different than a second magnitude of a second threshold voltage associated with the second logic state based at least in part on the second contact area being different than the first contact area.

Aspect 10: The method, apparatus, or non-transitory computer-readable medium of aspect 9 where the second magnitude is less than the first magnitude.

Aspect 11: The method, apparatus, or non-transitory computer-readable medium of any of aspects 9 through 10 where a magnitude of the first voltage is greater than the second magnitude and a magnitude of the second voltage is less than the first magnitude.

Aspect 12: The method, apparatus, or non-transitory computer-readable medium of any of aspects 1 through 11 where each memory cell of the set of memory cells includes a chalcogenide material.

Figure 8:
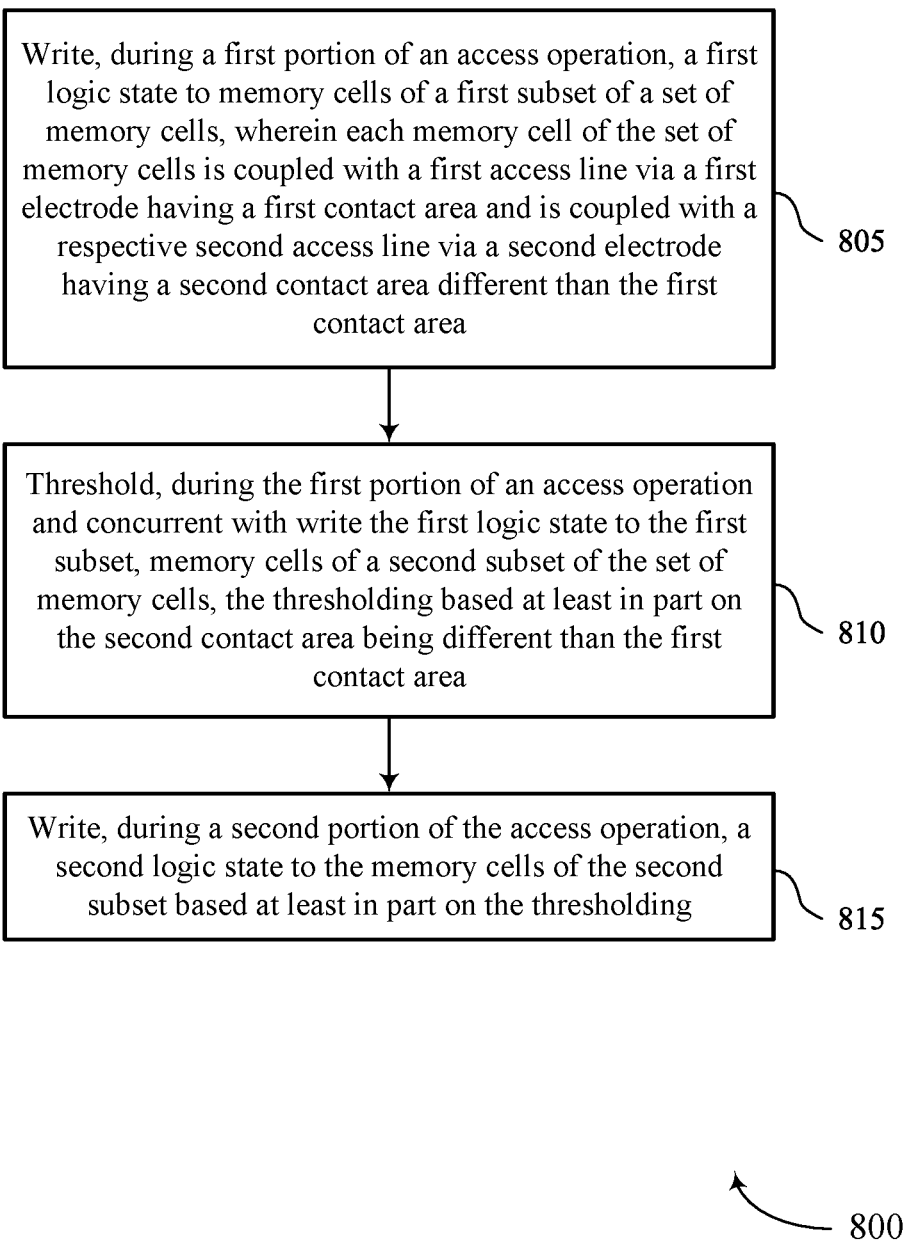

FIG. 8 shows a flowchart illustrating a method 800 that supports asymmetric memory cell design in accordance with examples as disclosed herein. The operations of method 800 may be implemented by a memory device or its components as described herein. For example, the operations of method 800 may be performed by a memory device as described with reference to FIGS. 1, 2, 3A, 3B, 4A, 4B, 5A through 5E, and 6. In some examples, a memory device may execute a set of instructions to control the functional elements of the device to perform the described functions. Additionally, or alternatively, the memory device may perform aspects of the described functions using special-purpose hardware.

At 805, the method may include writing, during a first portion of an access operation, a first logic state to memory cells of a first subset of a set of memory cells, where each memory cell of the set of memory cells is coupled with a first access line via a first electrode having a first contact area and is coupled with a respective second access line via a second electrode having a second contact area different than the first contact area. The operations of 805 may be performed in accordance with examples as disclosed herein. In some examples, aspects of the operations of 805 may be performed by a programming component 630 as described with reference to FIG. 6.

At 810, the method may include thresholding, during the first portion of an access operation and concurrent with writing the first logic state to the first subset, memory cells of a second subset of the set of memory cells, the thresholding based at least in part on the second contact area being different than the first contact area. The operations of 810 may be performed in accordance with examples as disclosed herein. In some examples, aspects of the operations of 810 may be performed by a thresholding component 635 as described with reference to FIG. 6.

At 815, the method may include writing, during a second portion of the access operation, a second logic state to the memory cells of the second subset based at least in part on the thresholding. The operations of 815 may be performed in accordance with examples as disclosed herein. In some examples, aspects of the operations of 815 may be performed by a programming component 630 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for writing, during a first portion of an access operation, a first logic state to memory cells of a first subset of a set of memory cells, where each memory cell of the set of memory cells is coupled with a first access line via a first electrode having a first contact area and is coupled with a respective second access line via a second electrode having a second contact area different than the first contact area; thresholding, during the first portion of an access operation and concurrent with writing the first logic state to the first subset, memory cells of a second subset of the set of memory cells, the thresholding based at least in part on the second contact area being different than the first contact area; and writing, during a second portion of the access operation, a second logic state to the memory cells of the second subset based at least in part on the thresholding.

Aspect 14: The method, apparatus, or non-transitory computer-readable medium of aspect 13 where the writing the first logic state to the memory cells of the first subset, and the thresholding the memory cells of the second subset includes operations, features, circuitry, logic, means, or instructions, or any combination thereof for applying a first programming pulse to the set of memory cells during the first portion of the access operation, where the first programming pulse has a first polarity.

Aspect 15: The method, apparatus, or non-transitory computer-readable medium of aspect 14 where the first programming pulse is applied to the first access line.

Aspect 16: The method, apparatus, or non-transitory computer-readable medium of any of aspects 14 through 15 where the writing the second logic state to the memory cells of the second subset includes operations, features, circuitry, logic, means, or instructions, or any combination thereof for applying a second programming pulse to the set of memory cells during the second portion of the access operation, where the second programming pulse has a second polarity that is different than the first polarity.

Aspect 17: The method, apparatus, or non-transitory computer-readable medium of aspect 16 where the second programming pulse is applied to the first access line.

Aspect 18: The method, apparatus, or non-transitory computer-readable medium of any of aspects 13 through 17 where the thresholding is further based at least in part on a logic state written to the memory cells of the second subset during a prior access operation.

Aspect 19: The method, apparatus, or non-transitory computer-readable medium of any of aspects 13 through 18 where each memory cell of the set of memory cells includes a chalcogenide material.

Figure 9:
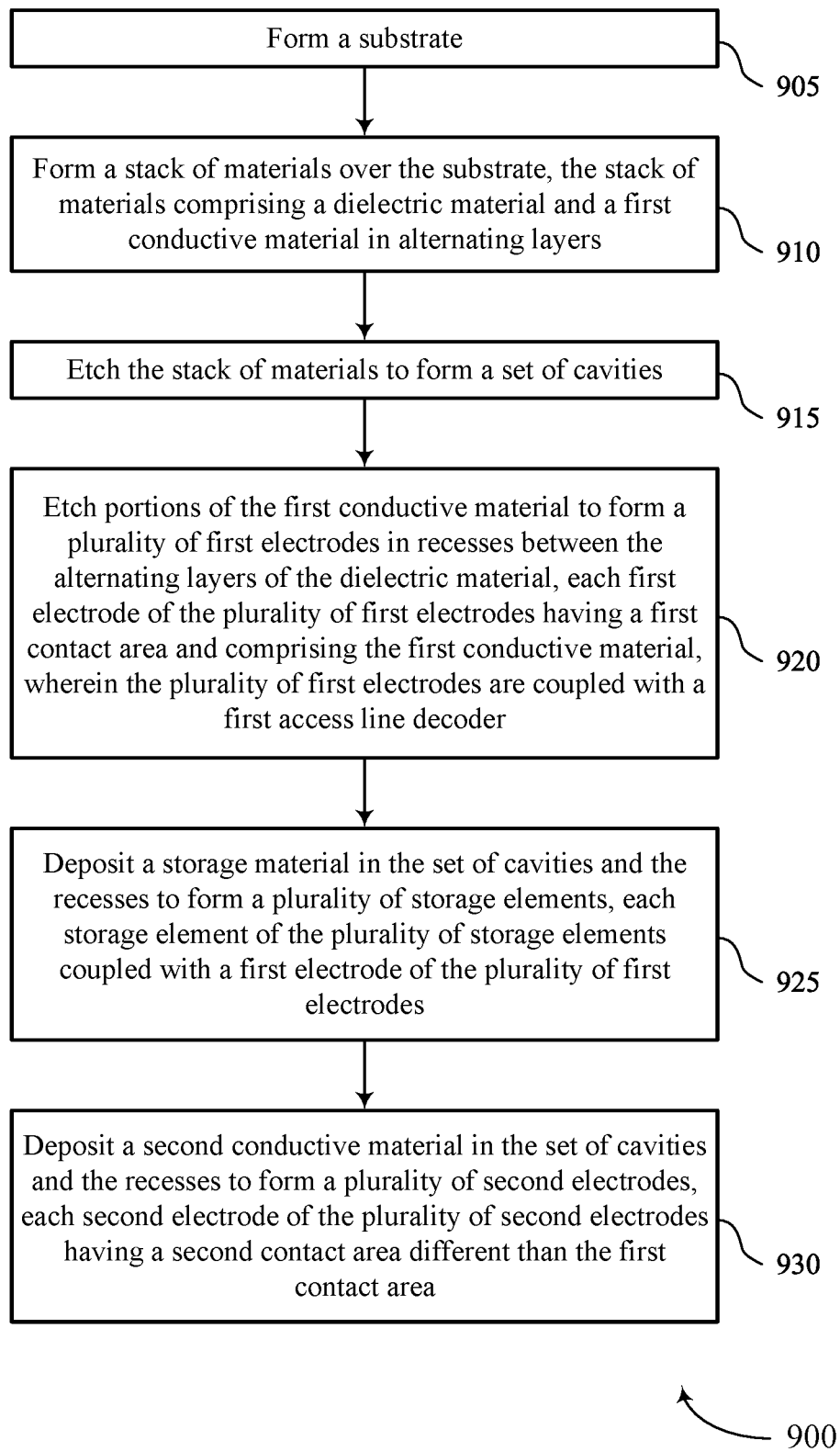

FIG. 9 shows a flowchart illustrating a method 900 that supports asymmetric memory cell design in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 905, the method may include forming a substrate. The operations of 905 may be performed in accordance with examples as disclosed herein.

At 910, the method may include forming a stack of materials over the substrate, the stack of materials including a dielectric material and a first conductive material in alternating layers. The operations of 910 may be performed in accordance with examples as described herein.

At 915, the method may include etching the stack of materials to form a set of cavities. The operations of 915 may be performed in accordance with examples as described herein.

At 920, the method may include etching portions of the first conductive material to form a plurality of first electrodes in recesses between the alternating layers of the dielectric material, each first electrode of the plurality of first electrodes having a first contact area and including the first conductive material, where the plurality of first electrodes are coupled with a first access line decoder. The operations of 920 may be performed in accordance with examples as described herein.

At 925, the method may include depositing a storage material in the set of cavities and the recesses to form a plurality of storage elements, each storage element of the plurality of storage elements coupled with a first electrode of the plurality of first electrodes. The operations of 925 may be performed in accordance with examples as described herein.

At 930, the method may include depositing a second conductive material in the set of cavities and the recesses to form a plurality of second electrodes, each second electrode of the plurality of second electrodes having a second contact area different than the first contact area. The operations of 930 may be performed in accordance with examples as described herein.

In some examples, an apparatus (e.g., a manufacturing system) as described herein may perform a method or methods, such as the method 900. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 20: A method or apparatus including operations, features, circuitry, logic, means, or instructions, or any combination thereof for forming a substrate; forming a stack of materials over the substrate, the stack of materials including a dielectric material and a first conductive material in alternating layers; etching the stack of materials to form a set of cavities; etching portions of the first conductive material to form a plurality of first electrodes in recesses between the alternating layers of the dielectric material, each first electrode of the plurality of first electrodes having a first contact area and including the first conductive material, where the plurality of first electrodes are coupled with a first access line decoder; depositing a storage material in the set of cavities and the recesses to form a plurality of storage elements, each storage element of the plurality of storage elements coupled with a first electrode of the plurality of first electrodes; and depositing a second conductive material in the set of cavities and the recesses to form a plurality of second electrodes, each second electrode of the plurality of second electrodes having a second contact area different than the first contact area.

Aspect 21: The method or apparatus of aspect 20, further including operations, features, circuitry, logic, means, or instructions, or any combination thereof for etching the second conductive material and the chalcogenide material to reform the set of cavities and depositing the second conductive material and a third conductive material in the set of cavities, the third conductive material coupled with a second access line decoder.

Aspect 22: The method or apparatus of any of aspects 20 through 21 where the first conductive material includes carbon, tungsten, or both and the second conductive material includes carbon, tungsten, or both.

Aspect 23: The method or apparatus of any of aspects 20 through 22 where the storage material includes a chalcogenide material.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 24: An apparatus, including: a set of memory cells; a first access line, where each memory cell of the set of memory cells is coupled with the first access line via a first electrode having a first contact area; a set of second access lines, where each memory cell of the set of memory cells is coupled with a respective second access line via a second electrode having a second contact area different than the first contact area; and a controller coupled with the first access line and the set of second access lines, the controller configured to cause the apparatus to: receive a command to write a first logic state to a first subset of the set of memory cells and a second logic state to a second subset of the set of memory cells; apply, during a first duration and in response to the command, a first voltage to the first access line, where, during the first duration, at least one memory cell of the second subset thresholds and at least one memory cell of the first subset is written to the first logic state based at least in part on applying the first voltage to the first access line, the thresholding based at least in part on the second contact area being different than the first contact area; and apply, during a second duration after the first duration and in response to the command, a second voltage to the first access line, where, during the second duration, the at least one memory cell of the second subset is written to the second logic state based at least in part on applying the second voltage to the first access line.

Aspect 25: The apparatus of aspect 24, where the controller is further configured to cause the apparatus to: apply, during the first duration, a third voltage to a second access line coupled with the at least one memory cell of the first subset, where the at least one memory cell of the first subset is written to the first logic state based at least in part on applying the third voltage to the second access line.

Aspect 26: The apparatus of aspect 25, where the controller is further configured to cause the apparatus to: apply, during the first duration, the third voltage to a second access line coupled with the at least one memory cell of the second subset, wherein the at least one memory cell of the second subset thresholds based at least in part on applying the third voltage to the second access line coupled with the at least one memory cell of the second subset.

Aspect 27: The apparatus of aspect 25, where the controller is further configured to cause the apparatus to: apply, during the second duration after the first duration, a fourth voltage to a second access line coupled with the at least one memory cell of the second subset, where the at least one memory cell of the second subset is written to the second logic state based at least in part on applying the fourth voltage to the second access line.

Aspect 28: The apparatus of aspect 27, where the third voltage has a first polarity and the fourth voltage has a second polarity different than the first polarity.

Aspect 29: The apparatus of any of aspects 24 through 28, where during the first duration, the at least one memory cell of the second subset thresholds based at least in part on a prior logic state written to the at least one memory cell of the second subset.

Aspect 30: The apparatus of any of aspects 24 through 29, where the first voltage has a first polarity and the second voltage has a second polarity different than the first polarity.

Aspect 31: The apparatus of any of aspects 24 through 30, where a magnitude of the first voltage and a magnitude of the second voltage include a same magnitude.

Aspect 32: The apparatus of any of aspects 24 through 31, where first magnitude of a first threshold voltage associated with the first logic state is different than a second magnitude of a second threshold voltage associated with the second logic state based at least in part on the second contact area being different than the first contact area.

Aspect 33: The apparatus of aspect 32, where the second magnitude is less than the first magnitude.

Aspect 34: The apparatus of any of aspects 32 through 33, where: a magnitude of the first voltage is greater than the second magnitude; and a magnitude of the second voltage is less than the first magnitude.

Aspect 35: The apparatus of any of aspects 24 through 34, where each memory cell of the set of memory cells includes a chalcogenide material.

An apparatus is described. The following provides an overview of aspects of the apparatus as described herein:

Aspect 36: An apparatus, including: a set of memory cells; a first access line, where each memory cell of the set of memory cells is coupled with the first access line via a first electrode having a first contact area; a set of second access lines, where each memory cell of the set of memory cells is coupled with a respective second access line via a second electrode having a second contact area different than the first contact area; and a controller coupled with the first access line and the set of second access lines, the controller configured to cause the apparatus to: write, during a first portion of an access operation, a first logic state to memory cells of a first subset of the set of memory cells; threshold, during the first portion of an access operation and concurrent with writing the first logic state to the first subset, memory cells of a second subset of the set of memory cells, the thresholding based at least in part on the second contact area being different than the first contact area; and write, during a second portion of the access operation, a second logic state to the memory cells of the second subset based at least in part on the thresholding.

Aspect 37: The apparatus of aspect 36, where, to write the first logic state to the memory cells of the first subset and to threshold the memory cells of the second subset, the controller is further configured to cause the apparatus to: apply a first programming pulse to the set of memory cells during the first portion of the access operation, where the first programming pulse has a first polarity.

Aspect 38: The apparatus of aspect 37, where the first programming pulse is applied to the first access line.

Aspect 39: The apparatus of any of aspects 37 through 38, where, to write the second logic state to the memory cells of the second subset, the controller is further configured to cause the apparatus to: apply a second programming pulse to the set of memory cells during the second portion of the access operation, where the second programming pulse has a second polarity that is different than the first polarity.

Aspect 40: The apparatus of aspect 39, where the second programming pulse is applied to the first access line.

Aspect 41: The apparatus of any of aspects 36 through 40, where the thresholding is further based at least in part on a logic state written to the memory cells of the second subset during a prior access operation.

Aspect 42: The apparatus of any of aspects 36 through 41, where each memory cell of the set of memory cells includes a chalcogenide material.

FIGS. 10A through 10F illustrate examples of processing steps 1000 that support asymmetric memory cell design in accordance with examples as disclosed herein. The processing steps 1000 illustrate various cross-sectional views of materials on a substrate 1005. The processing steps 1000 may implement aspects of the memory device 100 as described with reference to FIG. 1.

Figure 10A:
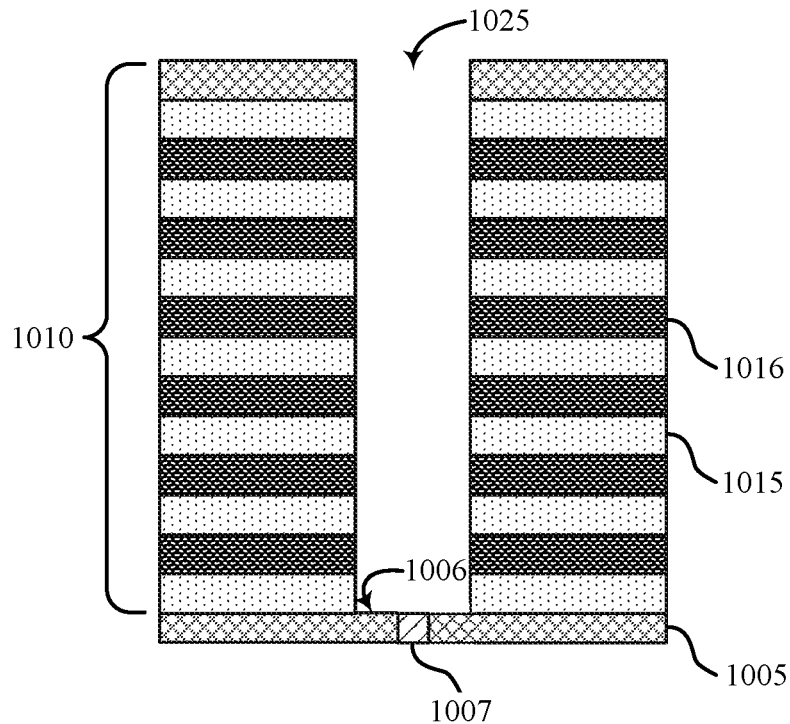
FIGS. 10A through 10F illustrate manufacturing steps of a process flow that supports asymmetric memory cell design in accordance with examples as disclosed herein.

In FIG. 10A, processing step 1000-a is depicted and includes a cross-sectional view of the memory architecture of a memory device before memory cell deposition. In the processing step 1000-a, a stack 1010 of materials may be formed on the substrate 1005. The stack 1010 may include alternating layers of a first dielectric material 1015 and an insulating material 1016. Any quantity of dielectric and insulating layers may be layered based on a desired height of the vertical stack of memory cells. The stack 1010 of materials (e.g., first dielectric material 1015 and insulating material 1016) may be etched to form one or more cavities 1025 and, in some examples, expose a surface 1006 of the substrate 1005 in the one or more cavities 1025. In some cases, the substrate 1005 may be etched to form the one or more cavities 1025 and a selector device 1007 (e.g., a thin film transistor) may be deposited into the one or more cavities 1025 (e.g., respectively deposited).

Figure 10B:
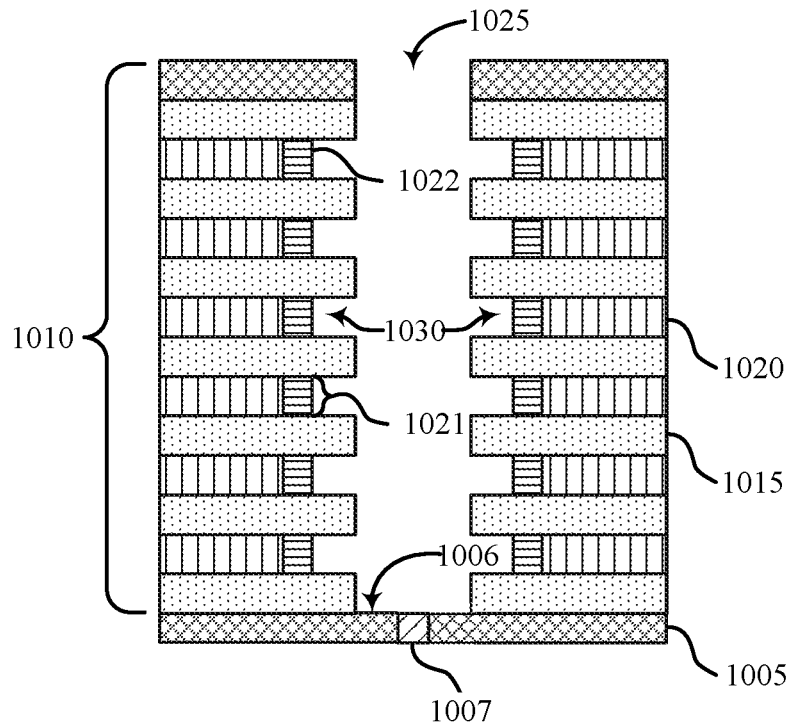
Figure 10B:
Figure 10B:
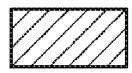
Figure 10B:
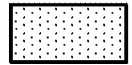
Figure 10B:

In FIG. 10B, processing step 1000-b is depicted and includes a cross-sectional view of the memory architecture of the memory device. In the processing step 1000-b, the insulating material 1016 may be removed (e.g., etched, exhumed) to form voids in which a first conductive material 1020 may be deposited to reform the stack 1010. The first conductive material 1020 may include carbon, tungsten, titanium nitride, a transition metal (e.g., a transition metal composite), or a combination thereof.

Portions of the first conductive material 1020 may be etched to form one or more recesses 1030 between the alternating layers of the first dielectric material 1015. A second conductive material 1022 (e.g., carbon, tungsten, titanium nitride, a transition metal, or a combination thereof) may be deposited in the recesses 1030. In some cases, the second conductive material 1022 may form a set of first electrodes in the recesses 1030. In some cases, the first electrodes may have a first contact area 1021 and may be coupled with a first access line decoder (e.g., a word line decoder).

Figure 10C:
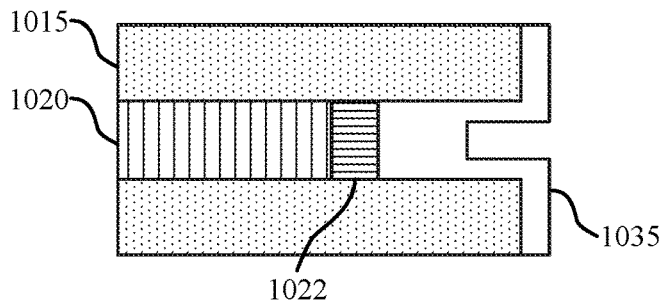
Figure 10C:
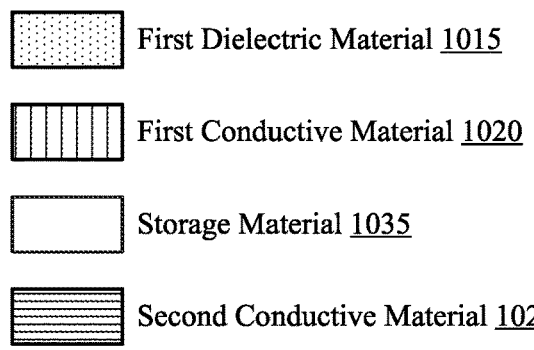

In FIG. 10C, processing step 1000-c is depicted and includes a cross-sectional view of the memory architecture of the memory device. In the processing step 1000-c, a storage material 1035 may be deposited into the recesses 1030 to form storage elements. In some cases, the storage material 1035 may be a chalcogenide material. In some cases, the storage material 1035 may be deposited into the recesses 1030 such that a portion of the recesses 1030 remains unfilled. For example, an outer surface of the storage material 1035 may not be coplanar with an outer surface of the first dielectric material 1015. Additionally, or alternatively, the storage material 1035 may be deposited into the recesses 1030 and additional storage material 1035 may be deposited on the surrounding dielectric material 1015 above and below the recesses 1030, as shown in the cross sectional view of FIG. 10C. In some cases, the storage elements may be coupled with the first electrodes. In some examples, the storage material 1035 may be conformally deposited such that a thickness of the storage material 1035 on each sidewall surrounding the recesses 1030 (including the sidewall coupled with the first electrode) is substantially the same.

Figure 10D:
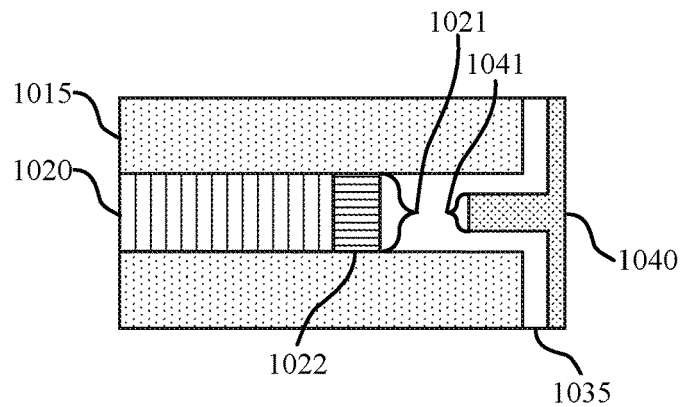
Figure 10D:
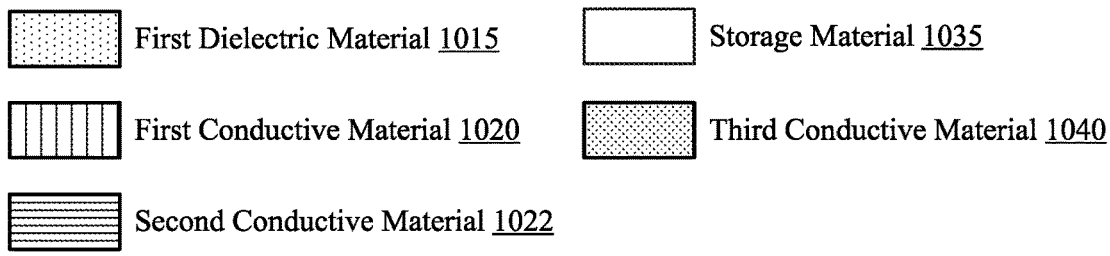

In FIG. 10D, processing step 1000-d is depicted and includes a cross-sectional view of the memory architecture of the memory device. In the processing step 1000-d, a third conductive material 1040 may be deposited into the recesses 1030 to form a set of second electrodes. The third conductive material 1040 may include carbon, tungsten, titanium nitride, a transition metal, or a combination thereof. In some cases, each second electrode may have a second contact area 1041 with different dimensions (e.g., a different width in a first direction, a different height in a second direction, or both) than the first contact area 1021 of the first electrode. For example, a first dimension (e.g., a width or a height) of the contact area 1021 may be greater than the first dimension of the contact area 1041. In some cases, the third conductive material 1040 may be deposited to fill the recesses 1030. In some examples, additional third conductive material 1040 may be deposited on the surrounding dielectric material 1015, such that a surface of the conductive material 1040 may be coplanar with the outer surface of the dielectric material 1015. In some examples, the additional third conductive material 1040 may be deposited on the additional storage material 1035 deposited on the surrounding dielectric material 1015, as shown in the cross sectional view of FIG. 10D.

Figure 10E:
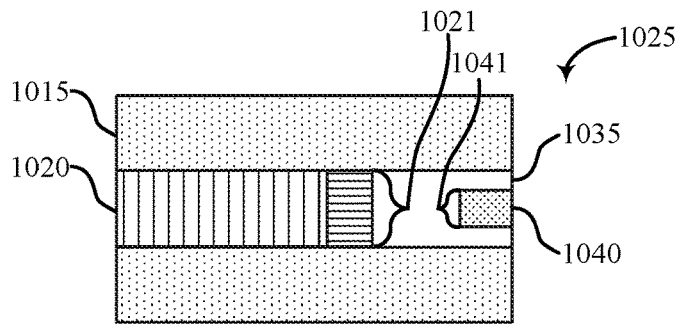
Figure 10E:
Figure 10E:
Figure 10E:
Figure 10E:
Figure 10E:
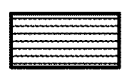

In FIG. 10E, processing step 1000-e is depicted and includes a cross-sectional view of the memory architecture of the memory device. In the processing step 1000-e, the third conductive material 1040 and the storage material 1035 may be etched to reform the one or more cavities 1025. In some examples, etching the third conductive material 1040 and the storage material 1035 may expose portions of the dielectric material 1015, the third conductive material 1040, or the storage material 1035. In some cases, the outer surfaces of the dielectric material 1015, the third conductive material 1040, and the storage material 1035 may be coplanar, as shown in the cross-sectional view of FIG. 10E.

Figure 10F:
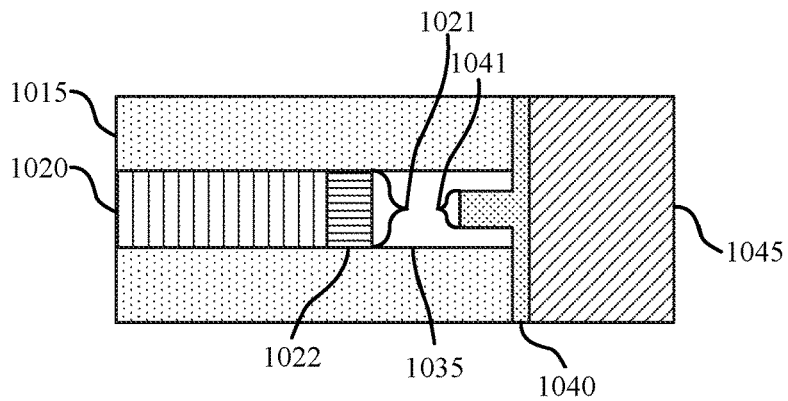
Figure 10F:
Figure 10F:
Figure 10F:
Figure 10F:
Figure 10F:
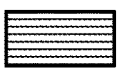
Figure 10F:
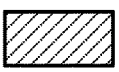

In FIG. 10F, processing step 1000-f is depicted and includes a cross-sectional view of the memory architecture of the memory device. In the processing step 1000-f, the third conductive material 1040 may be deposited in the reformed cavity 1025. In some cases, depositing the third conductive material 1040 in the reformed cavity 1025 may include depositing the third conductive material 1040 on the outer surfaces of the dielectric material 1015, the third conductive material 1040, and the storage material 1035. Additionally, in the processing step 1000-f, a fourth conductive material 1045 (e.g., carbon, tungsten, titanium nitride, a transition metal, or a combination thereof) may be deposited on the third conductive material 1040 deposited in the processing step 1000-f, as shown in the cross-sectional view of FIG. 10F. In some cases, the fourth conductive material 1045 may be coupled with a second access line decoder (e.g., a bit line decoder or a digit line decoder).

Figure 11:
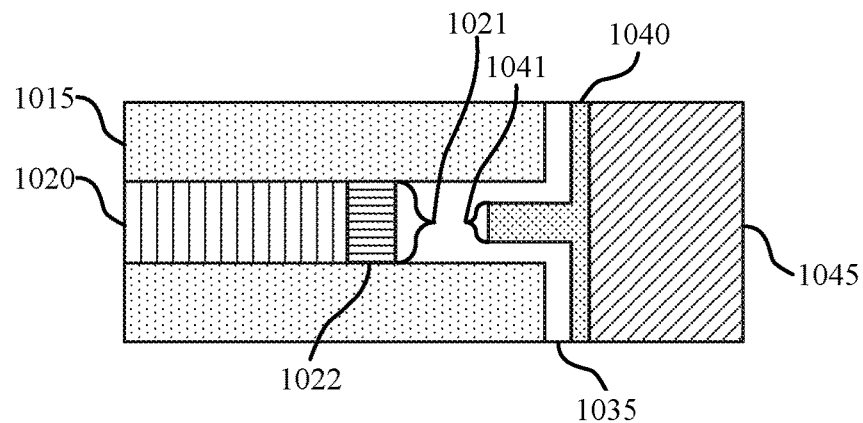
FIG. 11 illustrates a manufacturing step of a process flow that supports asymmetric memory cell design in accordance with examples as disclosed herein.
Figure 11:
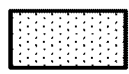
Figure 11:
Figure 11:
Figure 11:
Figure 11:
Figure 11:
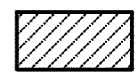

FIG. 11 illustrates an example of a processing step 1100 that supports asymmetric memory cell design in accordance with examples as disclosed herein. The processing step 1100 illustrates a cross-sectional view of a memory architecture of a memory device. The processing step 1100 may implement aspects of the memory device 100 as described with reference to FIG. 1.

The processing step 1100 may be performed after the processing step 1000-d described with reference to FIG. 10D. The processing step 1100 includes a cross-sectional view of materials on a substrate 1005 as described with reference to FIG. 10A. In the processing step 1100, a fourth conductive material 1045 (e.g., carbon, tungsten, titanium nitride, a transition metal, or a combination thereof) may be deposited on the third conductive material 1040 deposited in the processing step 1000-d, as shown in the cross-sectional view of FIG. 11. That is, in the processing step 1100, the fourth conductive material 1045 may be deposited in one or more cavities (e.g., the cavity 1025 described with reference to FIG. 10A) without the etching performed in the processing step 1000-e. In some cases, the fourth conductive material 1045 may be coupled with a second access line decoder (e.g., a bit line decoder or a digit line decoder).

Figure 12A:
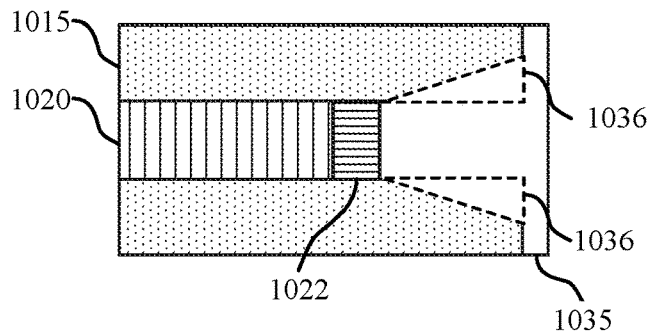
FIGS. 12A and 12B illustrate manufacturing steps of a process flow that supports asymmetric memory cell design in accordance with examples as disclosed herein.
Figure 12A:
Figure 12A:
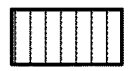
Figure 12A:
Figure 12A:
Figure 12B:
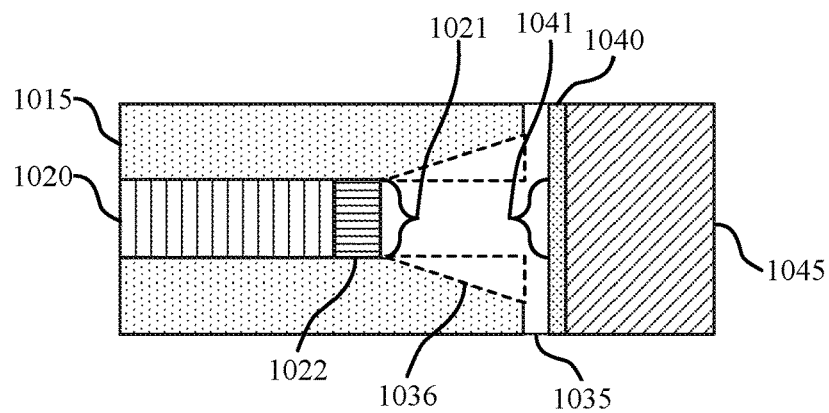
Figure 12B:
Figure 12B:
Figure 12B:
Figure 12B:
Figure 12B:
Figure 12B:

FIGS. 12A and 12B illustrate examples of processing steps 1200 that support asymmetric memory cell design in accordance with examples as disclosed herein. The processing steps 1200 illustrate various cross-sectional views of a memory architecture of a memory device. For example, the processing steps 1200 may implement aspects of the memory device 100 as described with reference to FIG. 1.

In FIG. 12A, processing step 1200-a is depicted and includes a cross-sectional view of materials on a substrate 1005 as described with reference to FIG. 10A. The processing step 1200-a may be performed after the processing step 1000-b described with reference to FIG. 10B. In the processing step 1200-a, a storage material 1035 may be deposited into one or more recesses (e.g., the recesses 1030 described with reference to FIG. 10B) to form storage elements. In some cases, the storage material 1035 may be a chalcogenide material. The storage material 1035 may be deposited such that the recesses are filled. Additional storage material 1035 may be deposited on the surrounding dielectric material 1015 above and below the recesses, as shown in the cross sectional view of FIG. 12A. That is, the storage material 1035 may be continuous between recesses and storage elements. In some cases, the storage elements may be coupled with a second conductive material 1022 (e.g., the first electrodes formed in the processing step 1000-b).

In some examples, prior to depositing the storage material 1035, portions 1036 of the first dielectric material 1015 may be removed (e.g., etched, exhumed). Based on removing the portions 1036, the storage material 1035 may be deposited to form storage elements with rounded corners or a tapered funnel, which may support the asymmetric memory cell design described herein. Additionally, or alternatively, the portions 1036 may be removed before the second conductive material 1022 is deposited in the processing step 1000-b.

In FIG. 12B, processing step 1200-b is depicted and includes a cross-sectional view of the memory architecture of the memory device. In the processing step 1200-b, a third conductive material 1040 (e.g., carbon, tungsten, titanium nitride, a transition metal, or a combination thereof) may be deposited to form a set of second electrodes. In some cases, each second electrode may have a second contact area 1041 with different dimensions (e.g., a different width in a first direction, a different height in a second direction, or both) than the first contact area 1021 of the first electrode. For example, a first dimension (e.g., a width or a height) of the contact area 1021 may be less than the first dimension of the contact area 1041. In some cases, depositing the third conductive material 1040 may include depositing the third conductive material 1040 on the outer surfaces of the storage material 1035. Additionally, in the processing step 1200-b, a fourth conductive material 1045 (e.g., carbon, tungsten, titanium nitride, a transition metal, or a combination thereof) may be deposited on the third conductive material 1040, as shown in the cross-sectional view of FIG. 12B. In some cases, the fourth conductive material 1045 may be coupled with a second access line decoder (e.g., a bit line decoder or a digit line decoder).

Figure 13A:
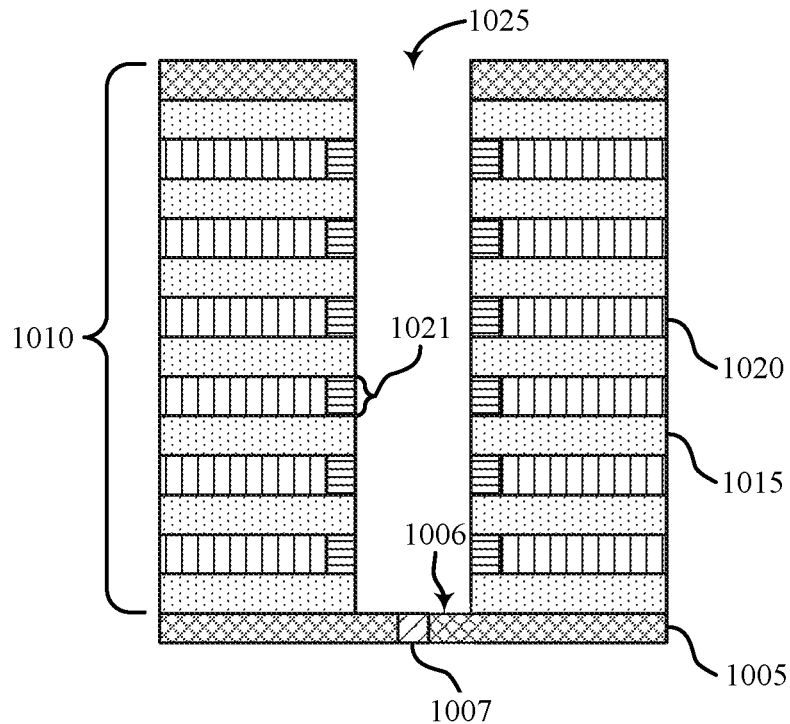
FIGS. 13A through 13C illustrate manufacturing steps of a process flow that supports asymmetric memory cell design in accordance with examples as disclosed herein.
Figure 13B:
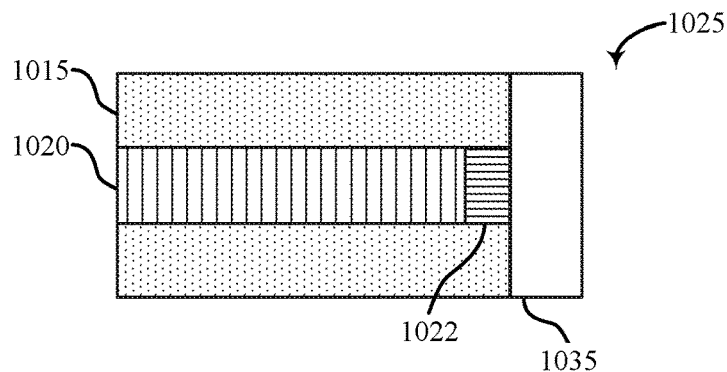
Figure 13C:
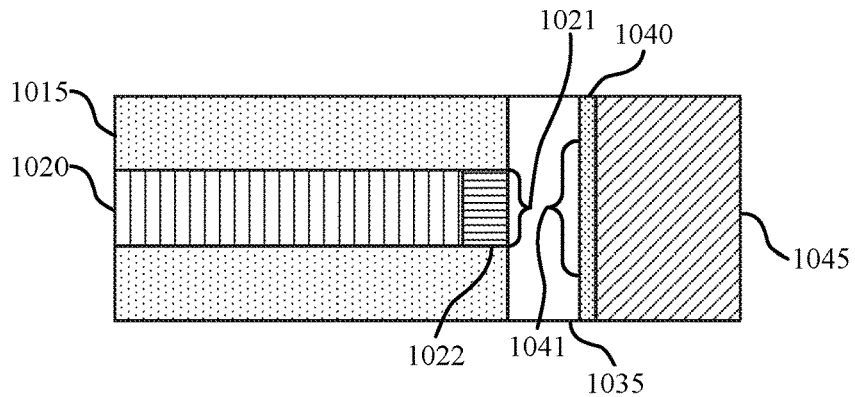

FIGS. 13A through 13C illustrate examples of processing steps 1300 that support asymmetric memory cell design in accordance with examples as disclosed herein. The processing steps 1300 illustrate various cross-sectional views of materials on a substrate 1005. The processing steps 1300 may implement aspects of the memory device 100 as described with reference to FIG. 1.

In FIG. 13A, processing step 1300-a is depicted and includes a cross-sectional view of materials on a substrate 1005 as described with reference to FIG. 10A. The processing step 1300-a may be performed after an insulating material is deposited in the processing step 1000-a described with reference to FIG. 10A. In the processing step 1300-a, the insulating material may be removed (e.g., etched, exhumed) to form voids in which a first conductive material 1020 may be deposited to form a stack 1010. The first conductive material 1020 may include carbon, tungsten, titanium nitride, a transition metal (e.g., a transition metal composite), or a combination thereof.

Portions of the first conductive material 1020 may be etched to form one or more recesses between the alternating layers of the first dielectric material 1015. A second conductive material 1022 (e.g., carbon, tungsten, titanium nitride, a transition metal, or a combination thereof) may be deposited to fill the recesses. In some cases, the second conductive material 1022 may form a set of first electrodes. In some cases, the first electrodes may have a first contact area 1021 and may be coupled with a first access line decoder (e.g., a word line decoder).

In FIG. 13B, processing step 1300-*b* is depicted and includes a cross-sectional view of materials on the substrate 1005. In the processing step 1300-*b*, a storage material 1035 may be deposited in the cavity 1025 to form storage elements. In some cases, the storage material 1035 may be a chalcogenide material. In some cases, the storage elements may be coupled with the second conductive material 1022. Additional storage material 1035 may be deposited on the surrounding dielectric material 1015 above and below the second conductive material 1022, as shown in the cross sectional view of FIG. 13B. That is, the storage material 1035 may be continuous between storage elements.

In FIG. 13C, processing step 1300-*c* is depicted and includes a cross-sectional view of the memory architecture of the memory device. In the processing step 1300-*c*, a third conductive material 1040 (e.g., carbon, tungsten, titanium nitride, a transition metal, or a combination thereof) may be deposited to form a set of second electrodes. In some cases, each second electrode may have a second contact area 1041 with different dimensions (e.g., a different width in a first direction, a different height in a second direction, or both) than the first contact area 1021 of the first electrode. For example, a first dimension (e.g., a width or a height) of the contact area 1021 may be less than the first dimension of the contact area 1041. In some cases, depositing the third conductive material 1040 may include depositing the third conductive material 1040 on the outer surfaces of the storage material 1035 in the cavity 1025. Additionally, in the processing step 1300-*c*, a fourth conductive material 1045 (e.g., carbon, tungsten, titanium nitride, a transition metal, or a combination thereof) may be deposited on the third conductive material 1040, as shown in the cross-sectional view of FIG. 13C. In some cases, the fourth conductive material 1045 may be coupled with a second access line decoder (e.g., a bit line decoder or a digit line decoder).

Figure 14:
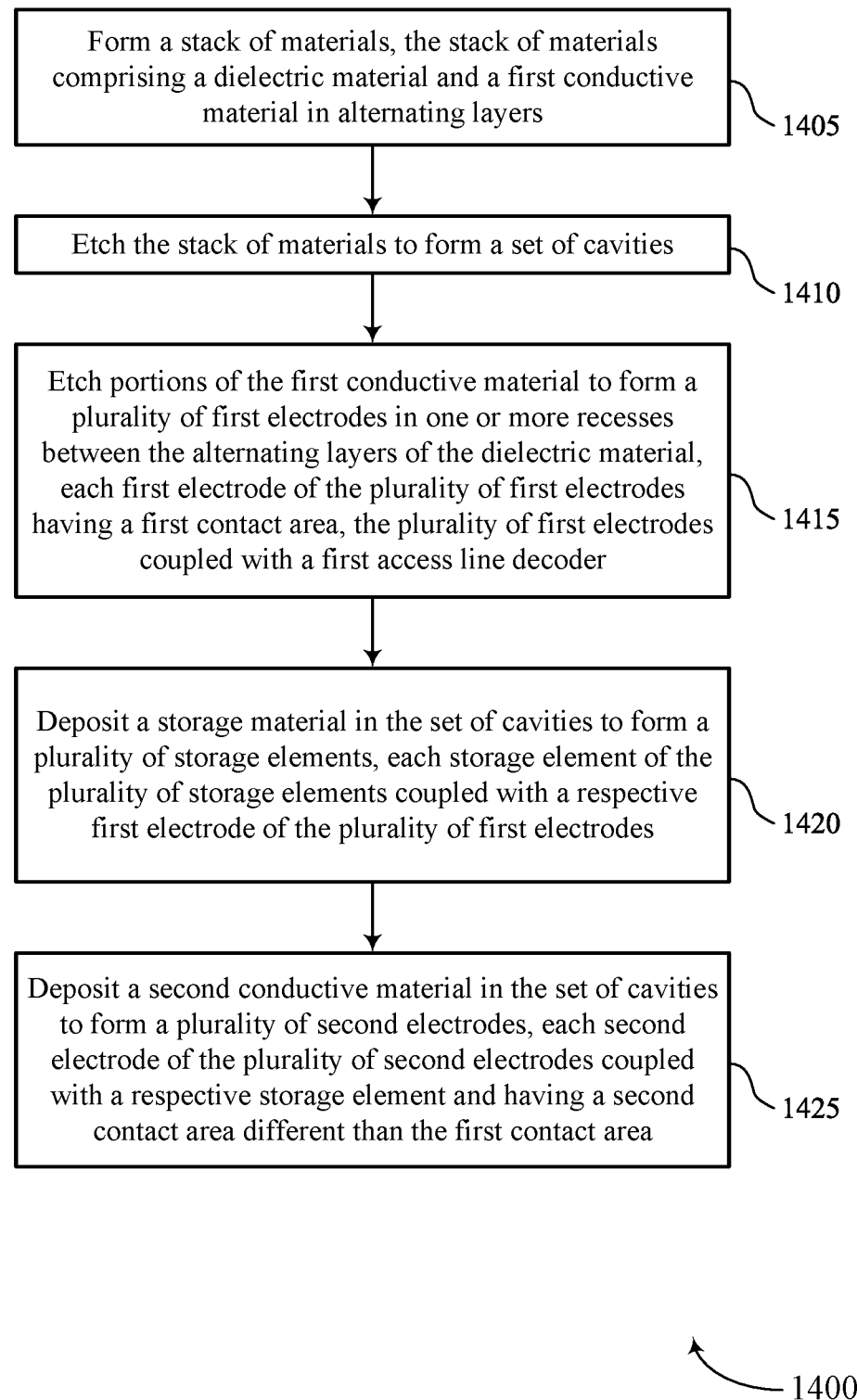
FIG. 14 shows a flowchart illustrating a method or methods that support asymmetric memory cell design in accordance with examples as disclosed herein.

FIG. 14 shows a flowchart illustrating a method 1400 that supports asymmetric memory cell design in accordance with examples as disclosed herein. The operations of method 1400 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1405, the method may include forming a stack of materials, the stack of materials including a dielectric material and a first conductive material in alternating layers. The operations of 1405 may be performed in accordance with examples as disclosed herein.

At 1410, the method may include etching the stack of materials to form a set of cavities. The operations of 1410 may be performed in accordance with examples as disclosed herein.

At 1415, the method may include etching portions of the first conductive material to form a plurality of first electrodes in recesses between the alternating layers of the dielectric material, each first electrode of the plurality of first electrodes having a first contact area, the plurality of first electrodes coupled with a first access line decoder. The operations of 1415 may be performed in accordance with examples as disclosed herein.

At 1420, the method may include depositing a storage material in the set of cavities to form a plurality of storage elements, each storage element of the plurality of storage elements coupled with a respective first electrode of the plurality of first electrodes. The operations of 1420 may be performed in accordance with examples as disclosed herein.

At 1425, the method may include depositing a second conductive material in the set of cavities to form a plurality of second electrodes, each second electrode of the plurality of second electrodes coupled with a respective storage element and having a second contact area different than the first contact area. The operations of 1425 may be performed in accordance with examples as disclosed herein.

In some examples, an apparatus as described herein may perform a method or methods, such as the method 1400. The apparatus may include features, circuitry, logic, means, or instructions (e.g., a non-transitory computer-readable medium storing instructions executable by a processor), or any combination thereof for performing the following aspects of the present disclosure:

Aspect 43: A method, apparatus, or non-transitory computer-readable medium including operations, features, circuitry, logic, means, or instructions, or any combination thereof for forming a stack of materials, the stack of materials including a dielectric material and a first conductive material in alternating layers; etching the stack of materials to form a set of cavities; etching portions of the first conductive material to form a plurality of first electrodes in recesses between the alternating layers of the dielectric material, each first electrode of the plurality of first electrodes having a first contact area, the plurality of first electrodes coupled with a first access line decoder; depositing a storage material in the set of cavities to form a plurality of storage elements, each storage element of the plurality of storage elements coupled with a respective first electrode of the plurality of first electrodes; and depositing a second conductive material in the set of cavities to form a plurality of second electrodes, each second electrode of the plurality of second electrodes coupled with a respective storage element and having a second contact area different than the first contact area.

Aspect 44: The method, apparatus, or non-transitory computer-readable medium of aspect 43, where depositing the storage material further includes operations, features, circuitry, logic, means, or instructions, or any combination thereof for depositing the storage material in the recesses to form the plurality of storage elements.

Aspect 45: The method, apparatus, or non-transitory computer-readable medium of aspect 44, further including operations, features, circuitry, logic, means, or instructions, or any combination thereof for depositing the second conductive material in the recesses to form the plurality of second electrodes.

Aspect 46: The method, apparatus, or non-transitory computer-readable medium of aspect 45, further including operations, features, circuitry, logic, means, or instructions, or any combination thereof for etching the second conductive material and the storage material.

Aspect 47: The method, apparatus, or non-transitory computer-readable medium of any of aspects 43 through 46, further including operations, features, circuitry, logic, means, or instructions, or any combination thereof for etching portions of the dielectric material before depositing the storage material.

Aspect 48: The method, apparatus, or non-transitory computer-readable medium of any of aspects 43 through 47, where a first dimension of the first contact area is less than the first dimension of the second contact area.

Aspect 49: The method, apparatus, or non-transitory computer-readable medium of any of aspects 43 through 48, where a first dimension of the first contact area is greater than the first dimension of the second contact area.

Aspect 50: The method, apparatus, or non-transitory computer-readable medium of any of aspects 43 through 49, further including operations, features, circuitry, logic, means, or instructions, or any combination thereof for depositing a third conductive material in the set of cavities, the third conductive material coupled with a second access line decoder.

Aspect 51: The method, apparatus, or non-transitory computer-readable medium of any of aspects 43 through 50, further including operations, features, circuitry, logic, means, or instructions, or any combination thereof for depositing a third conductive material in the recesses to form the plurality of first electrodes, where the storage material is deposited after depositing the third conductive material.

Aspect 52: The method, apparatus, or non-transitory computer-readable medium of aspect 51, where the third conductive material fills the recesses.

Aspect 53: The method, apparatus, or non-transitory computer-readable medium of any of aspects 43 through 52, where the first conductive material includes carbon, tungsten, titanium nitride, a transition metal, or any combination thereof and the second conductive material includes carbon, tungsten, titanium nitride, a transition metal, or any combination thereof.

Aspect 54: The method, apparatus, or non-transitory computer-readable medium of any of aspects 43 through 53, where the storage material includes a chalcogenide material.

Aspect 55: The method, apparatus, or non-transitory computer-readable medium of any of aspects 43 through 54, where forming the stack of materials includes operations, features, circuitry, logic, means, or instructions, or any combination thereof for depositing the dielectric material and an insulating material in the alternating layers; removing the insulating material to form voids between layers of the dielectric material; and depositing the first conductive material in the voids to form the stack of materials.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 56: An apparatus, including: a memory cell including a storage element; a first access line decoder coupled with the memory cell via a first electrode, the first electrode coupled with the storage element via a first contact area; and a second access line decoder coupled with the memory cell via a second electrode, the second electrode coupled with the storage element via a second contact area different than the first contact area.

Aspect 57: The apparatus of aspect 56, where a first dimension of the first contact area is less than the first dimension of the second contact area.

Aspect 58: The apparatus of any of aspects 56 through 57, where a first dimension of the first contact area is greater than the first dimension of the second contact area.

Aspect 59: The apparatus of any of aspects 56 through 58, where the storage element is coupled with a second storage element of a second memory cell.

Aspect 60: The apparatus of any of aspects 56 through 59, where: the first electrode includes carbon, tungsten, titanium nitride, a transition metal, or any combination thereof; and the second electrode includes carbon, tungsten, titanium nitride, a transition metal, or any combination thereof.

Aspect 61: The apparatus of any of aspects 56 through 60, where the storage element includes a chalcogenide material.

An apparatus is described. The following provides an overview of aspects of the apparatus as described herein:

Aspect 62: An apparatus, including: a set of memory cells, each memory cell including a respective storage element; a set of first access lines, each first access line coupled with a respective memory cell of the set of memory cells via a first electrode of a plurality of first electrodes, a respective first electrode coupled with a respective storage element of the respective memory cell via a first contact area; and a second access line coupled with each memory cell of the set of memory cells via a second electrode of a plurality of second electrodes, a respective second electrode coupled with the respective storage element of the respective memory cell via a second contact area different than the first contact area.

Aspect 63: The apparatus of aspect 62, where a first dimension of the first contact area is less than the first dimension of the second contact area.

Aspect 64: The apparatus of any of aspects 62 through 63, where a first dimension of the first contact area is greater than the first dimension of the second contact area.

Aspect 65: The apparatus of any of aspects 62 through 64, further including: a dielectric material between a first memory cell of the set of memory cells and a second memory cell of the set of memory cells.

Aspect 66: The apparatus of any of aspects 62 through 65, where a storage element of a first memory cell is coupled with a storage element of a second memory cell, the set of memory cells including the first memory cell and the second memory cell.

Aspect 67: The apparatus of any of aspects 62 through 66, where: the set of first access lines are coupled with a word line decoder; and the second access line is coupled with a bit line decoder.

Aspect 68: The apparatus of any of aspects 62 through 67, where: each first electrode includes carbon, tungsten, titanium nitride, a transition metal, or any combination thereof and each second electrode includes carbon, tungsten, titanium nitride, a transition metal, or any combination thereof.

Aspect 69: The apparatus of any of aspects 62 through 68, where each storage element includes a chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory cell comprising a storage material between and in contact with a first surface of a first dielectric layer and a second surface of a second dielectric layer;
a first access line decoder coupled with the memory cell via a first electrode, the first electrode coupled with the storage material via a first contact area extending between the first surface of the first dielectric layer and the second surface of the second dielectric layer; and
a second access line decoder coupled with the memory cell via a second electrode, the second electrode extending into a recess of the storage material between the first surface of the first dielectric layer and the second surface of the second dielectric layer, and the second electrode in contact with a third surface of the first dielectric layer and a fourth surface of the second dielectric layer.

2. The apparatus of claim 1, wherein the second electrode is coupled with the storage material via a second contact area, and a first dimension of the first contact area is greater than the first dimension of the second contact area.

3. The apparatus of claim 1, wherein:
the first electrode comprises carbon, tungsten, titanium nitride, a transition metal, or any combination thereof, and
the second electrode comprises carbon, tungsten, titanium nitride, a transition metal, or any combination thereof.

4. The apparatus of claim 1, wherein the storage material comprises a chalcogenide material.

5. The apparatus of claim 1, wherein the second electrode is coupled with the storage material via a second contact area at an end of the recess of the storage material that is smaller than the first contact area.

6. The apparatus of claim 1, wherein the second access line decoder is coupled with the memory cell via a third electrode coupled with the second electrode.

7. An apparatus, comprising:
a set of memory cells, each memory cell comprising a respective portion of a storage material between and in contact with a respective first surface of a first dielectric layer and a respective second surface of a second dielectric layer;
a set of first access lines, each first access line coupled with a respective memory cell of the set of memory cells via a first electrode of a plurality of first electrodes, a respective first electrode coupled with the respective portion of the storage material of the respective memory cell via a first contact area extending between the respective first surface of the first dielectric layer and the respective second surface of the second dielectric layer; and
a second access line coupled with each memory cell of the set of memory cells via a second electrode of a plurality of second electrodes, a respective second electrode extending into a respective recess of the storage material between the respective first surface of the first dielectric layer and the respective second surface of the second dielectric layer, and the respective second electrode in contact with a respective third surface of the first dielectric layer and a fourth surface of the second dielectric layer.

8. The apparatus of claim 7, wherein the respective second electrode is coupled with the respective portion of the storage material via a second contact area, and a first dimension of the first contact area is greater than the first dimension of the second contact area.

9. The apparatus of claim 7, further comprising:
a dielectric material between a first memory cell of the set of memory cells and a second memory cell of the set of memory cells.

10. The apparatus of claim 7, wherein:
the set of first access lines are coupled with a word line decoder; and
the second access line is coupled with a bit line decoder.

11. The apparatus of claim 7, wherein:
each first electrode comprises carbon, tungsten, titanium nitride, a transition metal, or any combination thereof, and
each second electrode comprises carbon, tungsten, titanium nitride, a transition metal, or any combination thereof.

12. The apparatus of claim 7, wherein the storage material comprises a chalcogenide material.

13. The apparatus of claim 7, wherein the respective second electrode is coupled with the respective portion of the storage material via a second contact area at an end of the respective recess of the storage material that is smaller than the first contact area.

14. The apparatus of claim 7, wherein the second access line is coupled with each memory cell of the set of memory cells via a third electrode of a plurality of third electrodes, a respective third electrode coupled with the respective second electrode.

* * * * *